(12) United States Patent
Hamdi et al.

(10) Patent No.: US 9,077,669 B2
(45) Date of Patent: Jul. 7, 2015

(54) EFFICIENT LOOKUP METHODS FOR TERNARY CONTENT ADDRESSABLE MEMORY AND ASSOCIATED DEVICES AND SYSTEMS

(75) Inventors: Mounir Hamdi, Hong Kong (CN); Dong Lin, Hong Kong (CN)

(73) Assignee: DYNAMIC INVENTION LLC, Victoria, Mahe (SC)

( * ) Notice: Subject to any disclaimer, the term of this patent is extended or adjusted under 35 U.S.C. 154(b) by 827 days.

(21) Appl. No.: 13/159,470

(22) Filed: Jun. 14, 2011

(65) Prior Publication Data
US 2011/0307656 A1    Dec. 15, 2011

Related U.S. Application Data

(60) Provisional application No. 61/354,328, filed on Jun. 14, 2010.

(51) Int. Cl.
*H04L 12/28* (2006.01)
*H04L 12/743* (2013.01)
*H04L 12/741* (2013.01)
*G11C 15/00* (2006.01)

(52) U.S. Cl.
CPC ............ *H04L 45/7453* (2013.01); *G11C 15/00* (2013.01); *H04L 45/54* (2013.01)

(58) Field of Classification Search
CPC ................. H04L 29/12132; H04L 45/7453; H04L 45/54; H04L 45/745
See application file for complete search history.

(56) References Cited

U.S. PATENT DOCUMENTS

| | | | | |
|---|---|---|---|---|
| 7,890,655 | B2 * | 2/2011 | Chandrasekaran | 709/238 |
| 7,986,696 | B1 * | 7/2011 | Miliavisky et al. | 370/392 |
| 8,572,140 | B1 * | 10/2013 | Mittal | 707/899 |
| 2003/0126113 | A1 * | 7/2003 | Brown | 707/1 |
| 2004/0100950 | A1 * | 5/2004 | Basu et al. | 370/389 |
| 2008/0080539 | A1 * | 4/2008 | Hong et al. | 370/402 |
| 2009/0150603 | A1 * | 6/2009 | Sahni et al. | 711/108 |
| 2011/0038375 | A1 * | 2/2011 | Liu et al. | 370/392 |
| 2011/0317704 | A1 * | 12/2011 | Brown et al. | 370/392 |
| 2012/0072380 | A1 * | 3/2012 | Liu et al. | 706/12 |
| 2013/0034096 | A1 * | 2/2013 | Hu et al. | 370/389 |

OTHER PUBLICATIONS

Guo et al, IP routing table compaction and sampling schemes to enhance TCAM cache performance, Jan. 2009, journal of Systems Architecture: the EUROMICRO journal, 28 pages.*
Y. Rekhter, T. Li, "An Architecture for IP Address Allocation with CIDR," RFC 1518, Sep. 1993.

(Continued)

*Primary Examiner* — Ayaz Shiekh
*Assistant Examiner* — Mounir Moutaouakil
(74) *Attorney, Agent, or Firm* — Amin, Turocy & Watson, LLP

(57) ABSTRACT

Lookup techniques are described, which can achieve improvements in energy efficiency, speed, and cost, of IP address lookup, for example, in devices and systems employing ternary content addressable memory (TCAM). The disclosed subject matter describes dividing a route table into several sub-tries with disjoint range boundaries. In addition, the disclosed subject matter describes storing sub-tries of a route table between a TCAM and a faster and less costly memory. The disclosed details enable various refinements and modifications according to system design and tradeoff considerations.

20 Claims, 14 Drawing Sheets

(56) References Cited

OTHER PUBLICATIONS

W. Doeringer, G. Karjoth, and M. Nassehi, "Routing on longest matching prefixes," IEEE Trans. Netw., vol. 4, No. 1, pp. 86-97, Feb. 1996.

M. J. Akhbarizadeh and M. Nourani, "Hardware-Based IP Routing Using Partitioned Lookup Table," IEEE Trans. Netw., vol. 13, No. 4, Aug. 2005.

M. A. Ruiz-Sanchez, E. W. Biersack and W. Dabbous, "Survey and Taxonomy of IP Address Lookup Algorithms," IEEE Network, pp. 8-23, Mar./Apr. 2001.

S. Nilsson and G. Karlsson, "IP address lookups using LC-tries," IEEE J. Sel. Areas Commun., vol. 17, No. 6, pp. 1083-1092, Jun. 1999.

B. Lampson, V. Srinivasan, and G. Varghese, "IP lookups using multiway and multicolumn search," IEEE Trans. Netw., vol. 7, No. 3, pp. 324-334, Jun. 1999.

Huston G. Route Table Analysis Reports (Jan. 2009). [Online]. Available: http://bgp.potaroo.net/.

P. Gupta, S. Lin, and N. McKeown, "Routing lookups in hardware at memory access speeds," in Proc. IEEE INFOCOM, Apr. 1998, pp. 1240-1247.

N. Huang et al., "A fast IP routing lookup scheme for gigabit switching routers," in Proc. IEEE INFOCOM, vol. 3, 1999, pp. 1429-1436.

H. Liu, "Routing table compaction in ternary CAM," IEEE Micro, vol. 22, No. 1, pp. 58-64, Jan.-Feb. 2002.

F. Zane et al., "CoolCAMs: Power-Efficient TCAMs for Forwarding Engines," INFOCOM 2003, vol. 1, pp. 42-52, Mar./Apr. 2003.

R. Panigrahy and S. Sharma, "Reducing TCAM Power Consumption and Increasing Throughput," Proceedings of Hotl 2002, pp. 107-112, Aug. 2002.

K. Zheng et al., "An ultra-high throughput and power efficient TCAM-based IP lookup engine," INFOCOM 2004, vol. 3, pp. 1984-1994, Mar. 2004.

D. Lin et al., "Route Table Partitioning and Load Balancing for Parallel Searching with TCAMs," 21st IEEE International Parallel & Distributed Processing Symposium—IPDPS '07, Long Beach, California USA.

University of Oregon Route Views Project. (Dec. 2008). [Online]. Available: http://routeviews.org/.

\* cited by examiner

EFFICIENT LOOKUP METHODS FOR TERNARY CONTENT ADDRESSABLE MEMORY AND ASSOCIATED DEVICES AND SYSTEMS

CROSS-REFERENCE TO RELATED APPLICATIONS

This application claims priority to U.S. Provisional Patent Application Ser. No. 61/354,328, filed on Jun. 14, 2010, and entitled COMPRESS THE ROUTE TABLE STORED IN TCAM BY USING "Memory Filter", the entirety of which is hereby incorporated by reference.

FIELD OF THE INVENTION

The disclosed subject matter relates generally to memory systems and in particular to methods for efficient lookup for ternary content addressable memory (TCAM) and associated devices and systems.

BACKGROUND OF THE INVENTION

With continuous advances in communications technology, link transmission speeds of Internet backbone networks have been increasing rapidly. In turn, this increase in network speeds demands more powerful Internet Protocol (IP) address lookup engines. For example, when receiving a packet by an Internet router, IP routing including IP route lookup can be one of the most time consuming operations, especially in Classless Inter-Domain Routing (CIDR) where Longest Prefix Matching (LPM) algorithms are employed. In addition, due to the increasing link bandwidth and the proliferation of real-time services, average packet sizes are continuously decreasing. As a result, because an Internet router typically performs one lookup per packet, this trend can be expected to increase the number of lookups per second at a rate faster than linear.

Ternary Content Addressable Memory (TCAM) is a fully associative memory that allows a "don't care" state to be stored in each memory cell in addition to zeros (0) and ones (1). For example, when a destination address is presented to a typical TCAM, each TCAM entry can be looked up in parallel, and the longest prefix that matches the address can be returned. Thus, a single TCAM access can be sufficient to perform a route lookup operation, in contrast to conventional ASIC-based designs that use many tries that can require multiple memory accesses for a single route lookup. Accordingly, routing latencies for TCAM-based routing tables can be significantly lower than conventional ASIC-based tables. As a result, TCAMs can return a matching result within only one memory access, which is typically much faster than software algorithmic approaches that require multiple memory accesses. Accordingly, TCAMs can be well-suited for high performance parallel lookups, and thus, TCAMs are widely employed for such IP route lookups in Internet domain routing.

Nevertheless, TCAM is not necessarily a panacea. For instance, memory access speed for TCAMs is slower than for conventional memories (e.g., Static random-access memory (SRAM), dynamic random-access memory (DRAM), etc.) while the power consumption is relatively higher. In addition, the size of route tables have been increasing at a rate of about 10-50 thousand entries per year. As can be expected with the proliferation of Internet Protocol version 6 (IPv6) deployments, even more route table storage will be needed.

For example, an increasing speed gap between logic function units, such as central processing unit (CPU), and memory. For instance, for the last few decades, speeds of logic units have been greatly developed while improvements in memory speeds have not matched pace. In addition, memory prices have decreased dramatically while larger memory sizes becomes available. As an example, a one gigabyte DRAM currently costs less than $10 U.S. In contrast with the high price and limited storage of TCAM, the gap of storage capacity between conventional memory and TCAM is getting larger and larger. Thus, it can be expected that, as link rates increase and route table sizes exceed limited storage capacities, the high power consumption and high costs associated with scaling TCAM implementations can result in further restrictions on application of TCAM in IP route lookup applications.

The above-described deficiencies are merely intended to provide an overview of some of the problems encountered in efficient lookup scheme design, and are not intended to be exhaustive. Other problems with the state of the art may become further apparent upon review of the description of the various non-limiting embodiments of the disclosed subject matter that follows.

SUMMARY OF THE INVENTION

In consideration of the above-described deficiencies of the state of the art, the disclosed subject matter provides efficient lookup methods and related devices and systems that can reduce cost and power consumption while improving throughput and storage capacity available. A simplified summary is provided herein to help enable a basic or general understanding of various aspects of exemplary, non-limiting embodiments that follow in the more detailed description and the accompanying drawings. This summary is not intended, however, as an extensive or exhaustive overview. The sole purpose of this summary is to present some concepts related to the various exemplary non-limiting embodiments of the disclosed subject matter in a simplified form as a prelude to the more detailed description that follows.

As further described herein, in various non-limiting implementations, the disclosed subject matter can facilitate increasing lookup throughput and reducing the power consumption of TCAM-based lookup engines or components while providing economic memory storage utilization. Accordingly, as a non-limiting example, a simple and efficient range-based partitioning algorithm disclosed and termed "Max-splitting," which can facilitate splitting the route table (e.g., the entire route table, substantially all of the entire route table, a subset and so on, etc.) into small sub-tries or sub-tables with disjoint boundaries. As, further described herein, exemplary implementations can support incremental updates and compression efficiently and can be easily extended to IPv6, and/or multi-stage indexes into memories (e.g., separate memories or otherwise), which can be pipelined.

Thus, in various embodiments, a lookup engine or component can be employed comprising TCAM-based lookup and lookup comprising logic function units and memory (e.g., a conventional memory), termed "Memory Filter," to achieve a more cost-effective IP lookup strategy as demonstrated by experiments on real-world route table data. As demonstrated herein, the partitioning method and the compression of index are flexible and easily customized for different requirements (e.g., more stages of index, smaller TCAM, being combined with other algorithms, and so on, etc.), while advantageously increasing the lookup throughput and significantly reducing power consumption.

According to various non-limiting embodiments, the disclosed subject matter provides methods that facilitate address lookup, such as IP address. According to further non-limiting embodiments of the disclosed subject, matter lookup systems such as IP address lookup systems are described. Additionally, various modifications are provided, which achieve a wide range of performance and computational overhead trade-offs according to system design considerations.

The following description and the annexed drawings set forth in detail certain illustrative aspects of the disclosed subject matter. These aspects are indicative, however, of but a few of the various ways in which the principles of the disclosed subject matter may be employed, and the disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

The lookup techniques and related devices, systems, and methods are further described with reference to the accompanying drawings in which.

DETAILED DESCRIPTION OF ILLUSTRATIVE EMBODIMENTS

Overview

Figure 1:
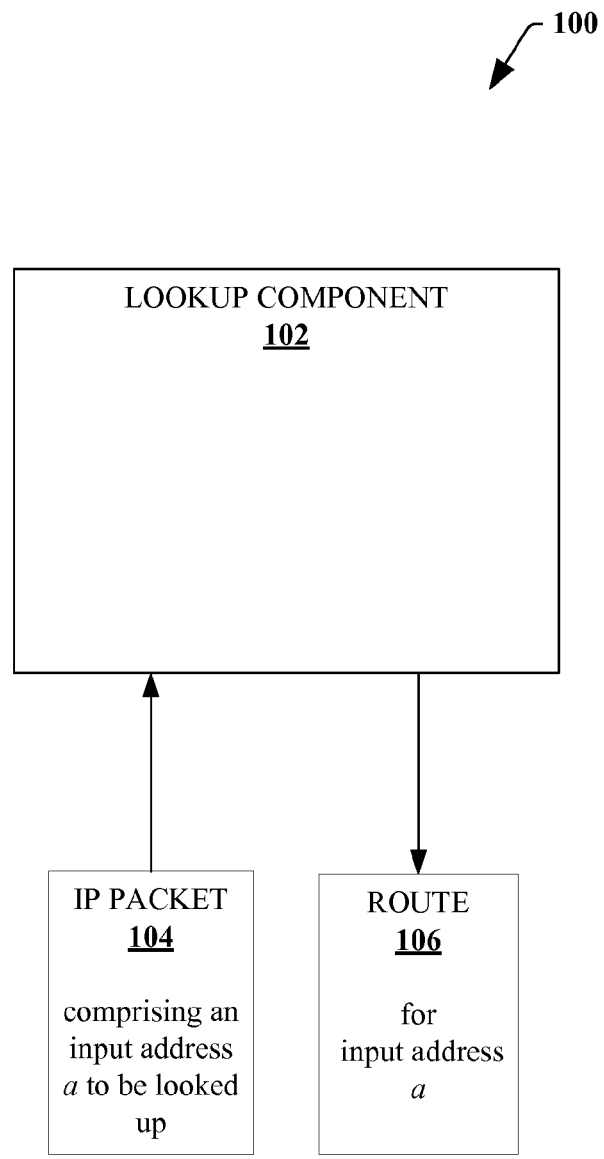
FIG. 1 illustrates a functional block diagram of an exemplary system that can facilitate efficient lookup associated with a memory component in accordance with an aspect of the subject matter as disclosed herein.

The disclosed subject matter is described with reference to the drawings, wherein like reference numerals are used to refer to like elements throughout. In the following description, for purposes of explanation, numerous specific details are set forth in order to provide a thorough understanding of the disclosed subject matter. It may be evident, however, that the disclosed subject matter may be practiced without these specific details. In other instances, well-known structures and devices are shown in block diagram form in order to facilitate describing the disclosed subject matter.

As briefly described above, several drawbacks exist that can prevent developing effective, economical, and efficient IP route lookup mechanisms that employ TCAM as link speeds increase and route table sizes escalate. The following provides a brief overview of the disclosed subject matter, conventional techniques, and associated considerations as an aid to understanding the disclosed subject matter as more fully described herein. As described above, TCAM memory access speed is slower than for conventional memories while the power consumption is relatively higher and more costly to scale due in part to TCAM costs. Thus, it can be expected that as link rates increase and route table sizes exceed limited storage capacities, the high power consumption and high costs associated with scaling TCAM implementations can result in further restrictions on application of TCAM in IP route lookup applications.

As mentioned, route lookup can be a major bottleneck in Internet routers. While TCAM can facilitate providing solutions to this bottleneck through various schemes and algorithms, such solutions are not without their drawbacks. For instance, TCAM-based route lookup schemes can include both single and/or parallel TCAM architectures, high memory efficiency, economical power dissipation, and balanced load among parallel TCAMs. In a further example, pruning and logic minimizing algorithms have been employed to reduce forwarding table sizes, which in turn can reduce memory cost and power consumption of TCAM schemes.

In addition, power-efficient lookup engines have been shown to benefit from a feature of some TCAMs called "partition-disable," which can facilitate splitting the entire routing table into multiple sub-tables or buckets, where each bucket can be laid out over one or more TCAM blocks. For instance, during a route lookup operation, only the block(s) containing prefixes that match the incoming IP address is (are) triggered instead of all the entries in the original table, which can result in a dramatic reduction in TCAM power consumption. Such designs can generally employ three kinds of conventional algorithms for partitioning the entire routing table (e.g., key-ID based, prefix trie-based, and range-based partitioning.

For example, key-ID partitioning can typically select some particular bits among the prefixes, and group the prefixes accordingly. However, key-ID partitioning can suffer from uneven sub-table sizes and uncontrolled redundancy, which can also result in a relatively higher memory and power cost. Moreover, trie-based partitioning can lower redundancy and unify sub-table sizes, but it can require an extra index TCAM to perform block selection. As a result, two TCAM accesses can be occupied for each lookup request. In another example, range-based algorithms can divide an entire route table into several sub-tables with even size and little redundancy which can maximize the usage of TCAM storage. However, range-based algorithms can require specified parallel comparison logic to perform bucket selection. As further evolution of such partitioning algorithms, some typically separate buckets or sub-tables into multiple TCAMs, which can achieve higher throughput, while excessive power consumption and lack of adequate storage can result.

Additionally, because TCAMs typically only hold partial route tables, load-balancing mechanisms can be employed to maximize overall throughput. Thus, despite load-balancing for parallel TCAMs, a basic strategy for TCAM-based systems can be to compress the route table entirely, trigger them partially during the searching, or a combination of both of these strategies as performance requirements dictate. For example, a route table can be pruned and minimized by deleting or merging prefixes having the same next hop. For range-based partitioning algorithms, a compressed route table can be divided into m sub-tables, where less than 1/m of the route table (e.g., more than a fixed number of prefixes) can be triggered during each lookup.

As described, TCAM's capability of parallel comparison among thousands of entries and its priority decoding is also associated with its relatively slower speed comparison than that of conventional memory, such as SRAM, for example. Compared to even faster logic function units, TCAM is a relatively slow technology. As a result, for comparison problems where there are limited number of prefixes, say less than 10, the combination of a conventional memory and a dedicated logic function units can outperform TCAM schemes in terms of lookup speed, which can imply shrinking or replacing TCAM in lookup schemes, at least for certain contexts. However, practical route tables can have many more prefixes. Thus, as further described herein, non-limiting combinations of conventional memory and TCAM can employ partitioning algorithms capable of rapidly searching and locating a limited number of prefixes (e.g., searching and locating a limited number of prefixes within one or two memory accesses, etc.).

Regarding suitable partitioning algorithms, a conventional indexing scheme can be the most straightforward idea to get possible matches quickly. As an example, for Internet Protocol version 4 (IPv4) deployments, an example two-level indirect lookup scheme can first index into a 16 million (M) entries index table with the leftmost 24 bits of the address. For instance, if the indexed prefix is shorter than or equal to 24 bits in length, then the prefix can be expanded to a 24-bit prefix. As a result, there can be several prefixes that match the same entry of index. Thus, the original mask length of prefixes can be further compared, and longest one can be chosen as the match of this entry. For those prefixes whose original length is longer than 24 bits, the content of the indexed location can be a pointer to a table in another memory bank, for example. However, the obvious drawbacks of this method are the exponentially increasing storage requirement for IPv6 and expensive route updating. However, despite the cost of prefix expansion, the comparison for each index entry during the updating is unacceptable.

In pursuit of an ultra-high lookup throughput that can meet the problems of ever-increasing link transmission speeds and rapidly growing route tables, various embodiments of the disclosed subject matter provide algorithms that can compress or reduce the size of route tables stored in the TCAM by exploiting the cost and power saving advantages of conventional memory over that of TCAM and the speed advantages of logic units (e.g., logic function units, logical function units, such as CPUs, etc.) over that of memory technologies (e.g., over that of TCAM in particular). Accordingly, non-limiting combinations of conventional memory and TCAM can employ partitioning algorithms as described herein that can facilitate rapidly searching and locating a limited number of prefixes (e.g., searching and locating a limited number of prefixes within one or two memory accesses, etc.). In various disclosed embodiments, an exemplary non-limiting lookup engine can comprise a dedicated logic function unit and a high bandwidth memory to handle sub-tables containing less than n prefixes. Accordingly, in various embodiments, an associated TCAM-based lookup system can merely store those sub-tables which contain more than n prefixes. As a For example, as described herein, an efficient range-based partitioning algorithm termed "Max-splitting," can facilitate dividing an entire route table into a multitude of independent sub-tables or sub-tries having disjoint range (e.g., disjoint range boundaries). For instance, in non-limiting aspects, an index created by "Max-splitting" and a lookup structure termed "Memory Filter" can facilitate storing some sub-tries outside of the TCAM, which in turn can compress or reduce the size of route tables stored in the TCAM. As a further non-limiting example, during a route lookup, instead of returning only one match, "Max-splitting" can facilitate locating possible matches in a sub-table by conducting a range comparison in the index table.

As further described below, both storage and power consumption of such TCAM-based lookup systems can be reduced as demonstrated by experiment (e.g., when n=4, the hybrid TCAM/Conventional system required only 7.35% of the original storage). For instance, experiments on real-life Border Gateway Protocol (BGP) route tables demonstrate that, by allocating more conventional memory space, various non-limiting embodiments of the disclosed subject matter can reduce TCAM storage requirement by 92% and significantly cut down on power consumption. According to further non-limiting aspects, various embodiments of the disclosed subject matter can efficiently support incremental updates and can be easily extended to IPv6.

According to further aspects, the disclosed subject matter advantageously provides flexible partitioning and index compression methods as demonstrated by experiments on real-life route tables to when determining suitable and optimal configurations of a multi-stage index for current IPv4 route tables. As can be understood, such configuration can be easily modified for different requirements, such as more stages of index, smaller TCAM or being combined with other algorithms. As demonstrated herein, by adding more conventional memory space, the various non-limiting implementations of the disclosed subject matter can increase the lookup throughput while significantly reducing power consumption.

FIG. 1 illustrates a functional block diagram of an exemplary system 100 that can facilitate efficient lookup associated with a memory component in accordance with an aspect of the subject matter as disclosed herein. In various embodiments, exemplary system 100 can comprise lookup component 102 that can receive an incoming IP packet 104 to be searched comprising an IP address to be looked up (e.g., a target IP address, etc.) and can transmit a route associated with the target IP address. As further described herein, according to various aspects of the disclosed subject matter, non-limiting systems 100 can compress or reduce the size of route tables stored in TCAM by exploiting the cost and power saving advantages of conventional memory over that of TCAM and the speed advantages of logic units (e.g., logic function units, logical function units, such as CPUs, etc.) over that of memory technologies (e.g., over that of TCAM in particular). Accordingly, various non-limiting implementations of the disclosed subject matter can provide systems and devices that can facilitate address lookup, as further described herein, for example regarding FIGS. 2, 8 and 13-14.

Figure 2:
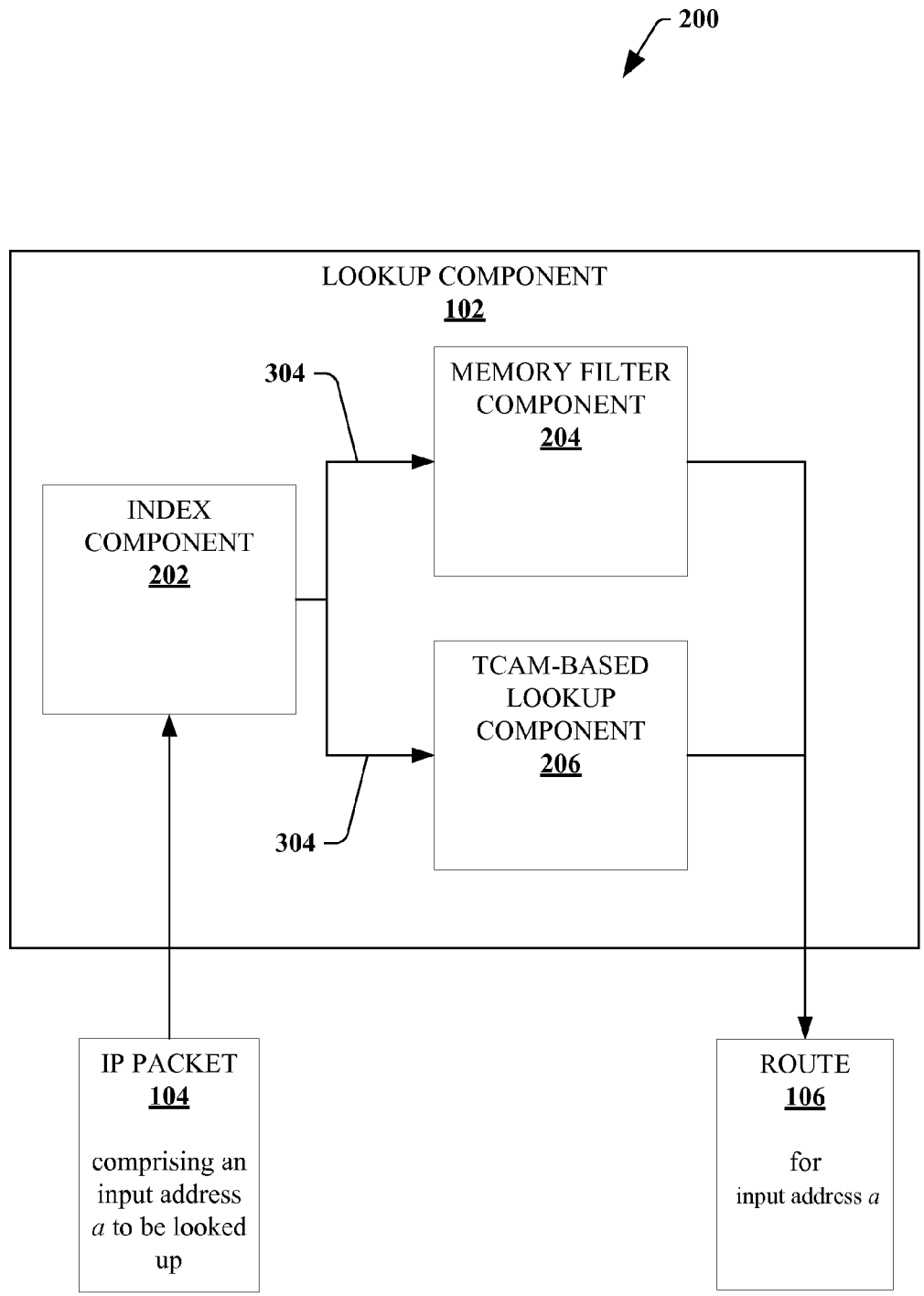
FIG. 2 illustrates a functional block diagram of a further non-limiting system that can facilitate efficient lookup associated with a memory component as disclosed herein.
Figure 7:
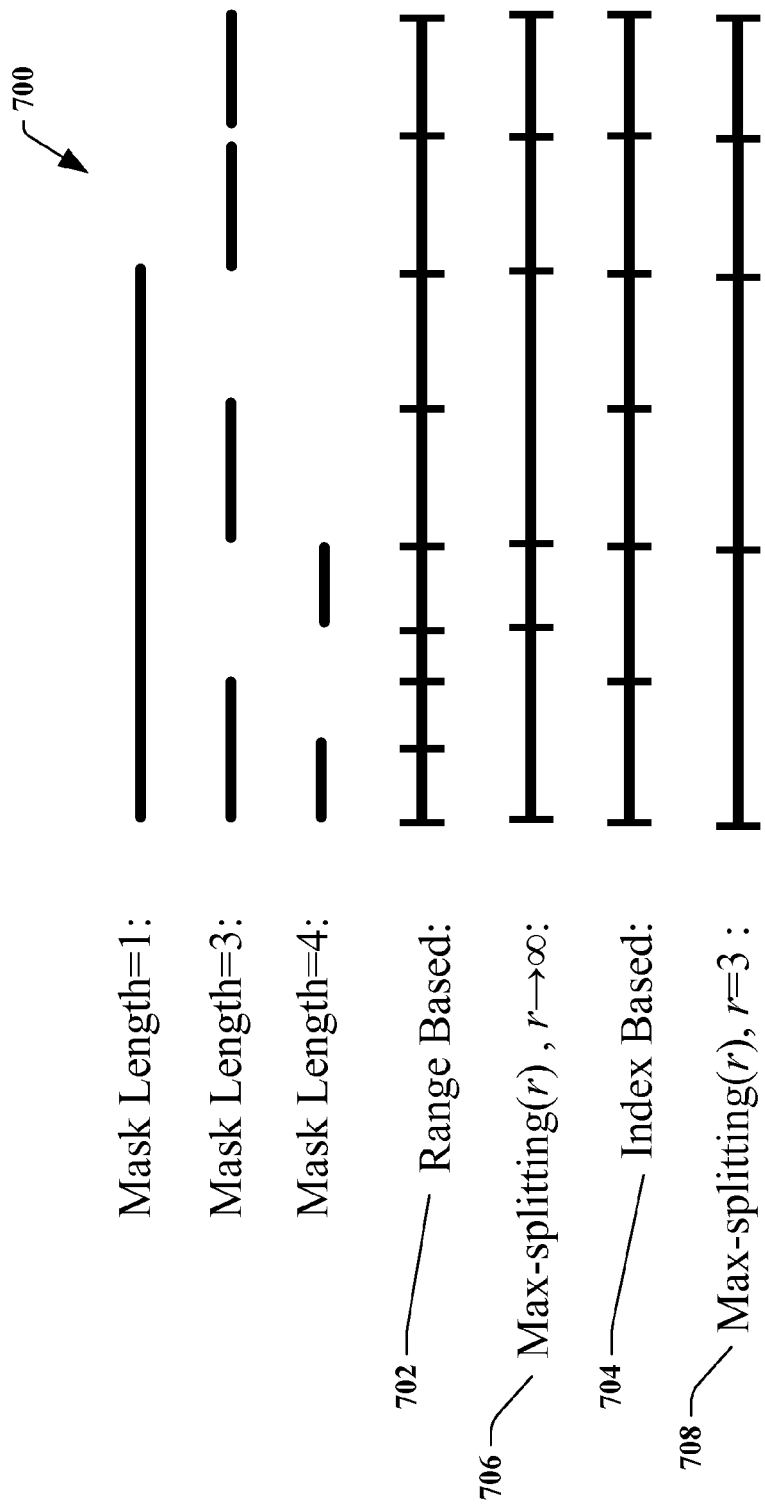
FIG. 7 depicts a comparison of conventional range-based algorithms and index-based algorithms with exemplary range-based partitioning algorithms according to non-limiting aspects of the disclosed subject matter.
Figure 8:
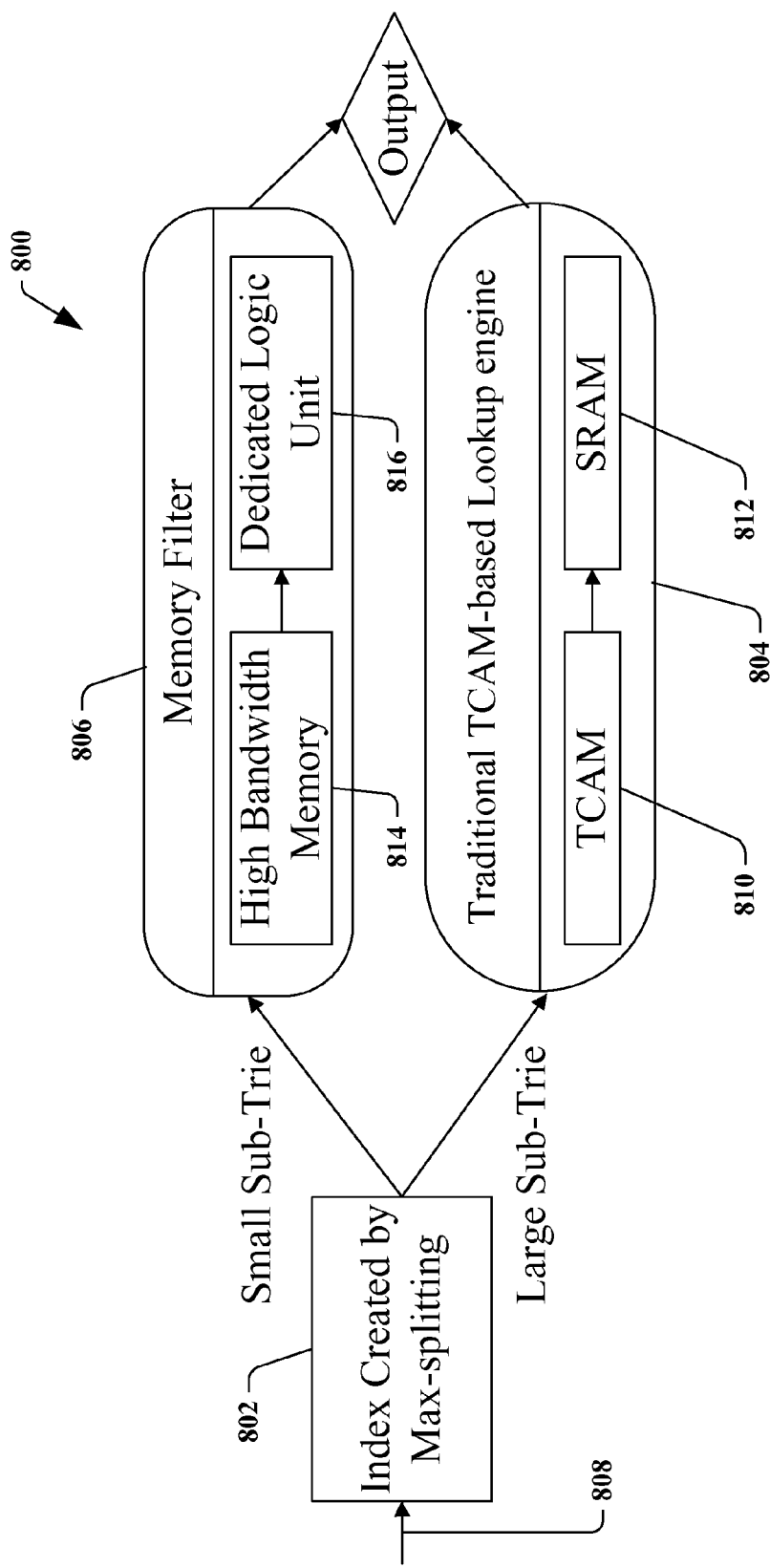
FIG. 8 illustrates a functional block diagram of an exemplary system that can facilitate efficient lookup associated with a memory component in accordance with an aspect of the subject matter as disclosed herein.

FIG. 2 illustrates a functional block diagram of a further non-limiting system 200 that can facilitate efficient lookup associated with a memory component as disclosed herein. As a non-limiting example, system 200 can comprise an IP address lookup system, as further described below, regarding FIG. 8. As further described below regarding FIGS. 4-8 system 200 can be described as a hardware and/or software architecture of a lookup engine or component 102 adapted to employ algorithms and associated and/or ancillary operations as described herein. For example, FIG. 2 illustrates an exemplary structure for a non-limiting lookup engine or component that can comprise an index created by "Max-splitting" (or other suitable partitioning algorithm or algorithms) in index component 202, a TCAM-based lookup engine or component 204 (e.g., a traditional TCAM-based lookup engine or component, a suitable variant thereof, etc.), and a memory and logic function unit lookup engine or component 206 termed "Memory Filter." As further described herein regarding FIG. 8, given an incoming IP packet to be searched (not shown) comprising an IP address to be looked up (e.g., a target IP address, etc.), the IP address can be extracted and delivered to the index (e.g., via index component 202, etc.), according to a non-limiting aspect, for performance of aspects of the disclosed subject matter.

Accordingly, various non-limiting implementations of the disclosed subject matter can provide systems and devices that can facilitate address lookup. For instance, as a non-limiting example, exemplary system 200 can comprise an IP address lookup system, as further described below, regarding FIG. 8. In a non-limiting example, an IP address lookup system 200 can comprise an index component 202 adapted to generate an index based on a route table and to divide the route table based on the index into one or more sub-tries, according to various non-limiting aspects. According to another aspect, index component 202 can be further configured to generate the index with a range-based partitioning algorithm. For instance, as further described below regarding FIGS. 3-6, an index can be created by employing "Max-splitting" (or other suitable partitioning algorithm or algorithms) in index component 202.

In another non-limiting aspect, index component 202 can be further configured to divide the route table into the one or more sub-tries having disjoint range boundaries, as described below. In addition, the index component 202 can be further configured to generate, for a reference node as described herein, one or more respective sub-trie prefixes for the one or more sub-tries and associated sets of high and low ranges. In a further non-limiting aspect, IP address lookup system 200 can be further configured to compress the index as described herein, for example, or via other conventional methods.

Moreover, IP address lookup system 200 can be further configured to receive a packet comprising a target IP address falling within one of the sets of associated high and low ranges and/or transmit a route associated with the target IP address based in part on the reference nodes. For instance, given an incoming IP packet 102 comprising an IP address to be searched, the IP address can be extracted and provided to the index component 202, which, by reference to the index, can return a sub-trie number indicating possible matches. If this sub-trie comprises more than n prefixes, store and lookup for this sub-trie can be directed to TCAM-based lookup component 206. Otherwise, store and lookup for this sub-trie can be directed to the Memory Filter component 204.

In still other non-limiting implementations, an IP address lookup system 200 can further comprise a Memory Filter component 204 that can be configured to store a first set of the one or more sub-tries in a memory (e.g., a conventional memory, a Memory Filter component 204 subcomponent, and so on, etc.). In still other exemplary implementations, IP address lookup system 200 can comprise a TCAM-based lookup component 206 that can be adapted to store a second set of the one or more sub-tries in a TCAM. According to further non-limiting embodiments, the Memory Filter component 204 and the TCAM-based lookup component 206 can be further configured to store the first and second sets based on the number of prefixes in the sub-table being less than or greater than a predetermined number, respectively, as further described below regarding FIG. 8.

Thus, as further described herein, an IP address lookup system 200 can compress or reduce the size of route tables stored in the TCAM by exploiting the cost and power saving advantages of conventional memory over that of TCAM and the speed advantages of logic units (e.g., logic function units, logical function units, such as CPUs, etc.) over that of memory technologies (e.g., over that of TCAM in particular).

Figure 3:
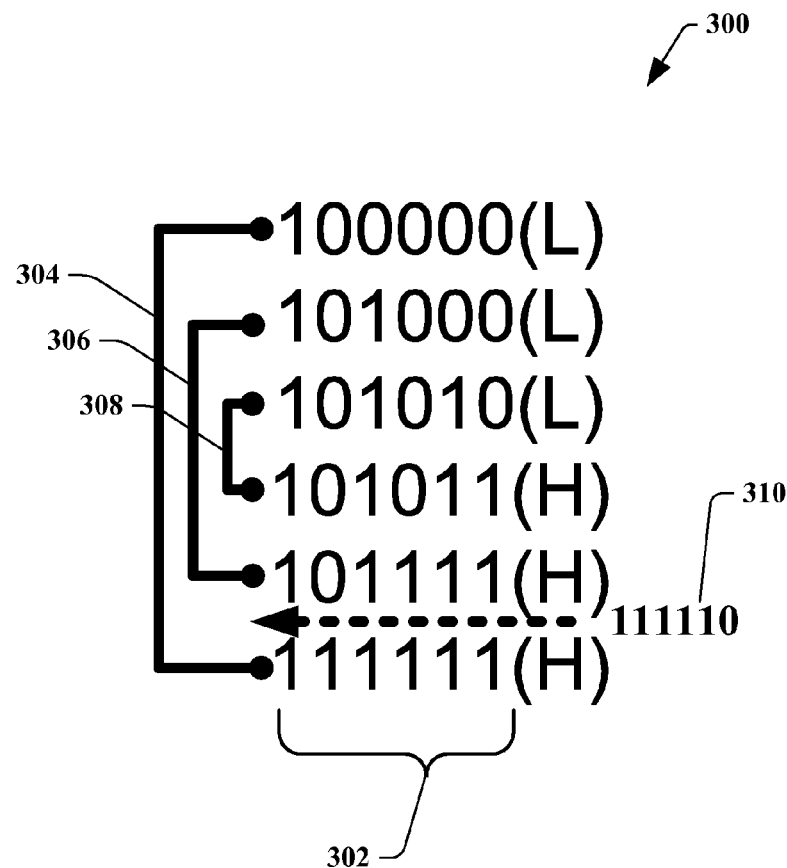
FIG. 3 depicts an exemplary binary search table suitable for demonstrating non-limiting aspects of various embodiments of the disclosed subject matter.
Figure 3:
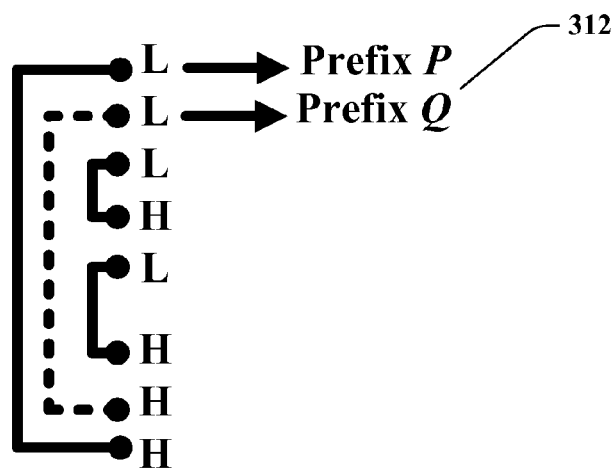

FIG. 3 depicts an exemplary binary search table 300 suitable for demonstrating non-limiting aspects of various embodiments of the disclosed subject matter. As described, an efficient range-based partitioning algorithm termed "Max-splitting," can facilitate dividing an entire route table into a multitude of independent sub-tables or sub-tries having disjoint range (e.g., disjoint range boundaries). For instance, as described below, various embodiments of the disclosed subject matter can facilitate routing table partitioning via employment of algorithm adapted to divide a route table (e.g., an entire route table) into sub-tables (e.g., one or more independent sub-tables, etc.).

As an aid to understanding the discussion of range-based algorithms, it can be assumed for illustration and not limitation that, in the examples of FIG. 3 discussing conventional range-based partitioning generally, there can be 6 bit addresses 302 and three prefixes 1*, 101*, and 10101*. As can be understood, binary search typically is employed with fixed length strings. Thus, to employ binary search on the three prefixes, each prefix can be padded to be a 6 bit string by adding zeroes and ones respectively to achieve three pairs (304, 306, 308) of range boundaries associated with each six bit address represented by the three prefixes 1*, 101*, and 10101*. After sorting, the address space can be divided into disjoint parts as illustrated in FIG. 3. Then when conducting a simple binary search, the longest matched prefix can be found. As a non-limiting example, taking "111110" (310) as an input prefix 310, it can be seen in FIG. 3 that the input prefix 310 falls into the range of [101111, 111111], and therefore it can be determined that the input prefix 310 matches the prefix of 1*.

One conventional range-based partitioning algorithm employs an O(N) stack-based algorithm to build this binary search table 300, where N denotes the number of prefixes in the route table. For instance, the algorithm can start with sorted prefixes with high and low boundaries which latter are processed by using a stack. Thus, whenever a low point (e.g., denoted as L in FIG. 3) is encountered, the corresponding prefix can be stacked. Whenever a corresponding high point (e.g., denoted as H in FIG. 3), the prefix can be popped from the stack. Intuitively, such conventional algorithms can keep track of currently active ranges and longest matched prefix. However, range coverage information maintained by the stack is volatile and multiple coverage information is typically not allowed, which can lead to the so-called O(N) update issue. In other words an addition/deletion of a prefix could, but not always, affect the pre-computed information in O(N) prefixes. FIG. 3 further depicts that, by adding/removing a prefix Q (dotted line) 312 can cause all regions between two prefixes' boundaries to move from Prefix P/Q to Prefix Q/P. Thus, it can be seen that certainty in maintaining accurate matched results for all range areas is neither practical nor efficient under some circumstances.

As described above, conventional range-based partitioning algorithms can suffer from drawbacks. To these and related ends, various embodiments of the disclosed subject matter can employ range-based partitioning algorithms termed "Max-splitting." In a non-limiting aspect, "Max-splitting"

can be described as occurring over one or more steps (e.g., two steps in exemplary non-limiting embodiments, etc.). As a non-limiting example, first, a routing trie can be constructed by using a route table. Second, sub-tries of the 1-bit trie can be successively carved out and mapped into an individual routing group. According to various non limiting embodiments, the disclosed subject matter can employ various data structures (e.g., a level compressed trie or LC-trie, and so on, etc.). However, for the sake of illustration, and not limitation, a 1-bit trie is described herein. For instance, FIGS. 4-6 demonstrate an exemplary 1-bit trie, built from a route table, having black nodes denoting prefix nodes, and output associated with an exemplary range-based partitioning algorithm as described herein. In addition, a reference node can be defined as the next prefix node of current prefix node in the order of pre-order traversal. For example, the reference node of "01*" is "1*", and their corresponding length are two and one respectively, where "*" indicates the start of don't-care bits.

The following pseudo-code provides an aid to further non-limiting description of a "Max-splitting" range-based partitioning algorithm, suitable for demonstrating further aspects of the disclosed subject matter, assuming the address space is s bits, where TOP can denote the value of continuous s-bit "1," where REF can denote an s bits value which can be derived by padding zeros to the corresponding prefix of a reference node.

```
Max-splitting (r) {
u=0;
    create a new sub-trie[u];
    set the range of sub-trie[u] as "[0, TOP]";
    while(exist un-visited prefix) {
        while(exist un-visited prefix) {
            get a prefix node by pre-order
            traversal;
            if(sub-trie[u] is empty) {
                save this prefix node to sub-
                    trie[u];
                save its ancestor prefix nodes to
                    sub-trie[u];
            }
            else{
                save this prefix node to sub-
                    trie[u];
            }
            if(the length of current reference node
            ≤ r and the reference node doesn't
            locate on the leftmost branch of
            current prefix node ) {
                set the range of sub-trie[u] as "[0,
                    REF-1]";
                u++;
                create a new sub-trie[u];
                set the range of sub-trie[u] as
                "[REF, TOP]";
                    break;
            }
        }
    }
    return sub-tries and their range;
}
```

Note that this algorithm takes a parameter r, denoting the length of acceptable reference node, and provides output as one or more sub-tries with disjoint boundaries. For instance, it can be seen that during the splitting, the trie (e.g., the entire trie, substantially all of the entire trie, a subset and so on etc.) can be traversed in pre-order looking for a prefix node, where, if a prefix node is encountered, it can be saved in a sub-trie and its reference node can be tested. For example, it can be determined whether the conditions are satisfied that 1) the length of reference node=r and 2) the reference node does not locate on the leftmost branch of current prefix node, and, based on this determination, this prefix node can be chosen as a break point, where the current sub-trie can end, and a new sub-trie can be created. For instance, assuming the original address space of the trie is [x, y]. After splitting, the address space for both sub-trie and remained trie can become [x, REF-1] and [REF, y], where REF can be derived by padding zero to the reference node. In addition, for every new sub-trie, the ancestor prefix nodes of the first prefix node can also be included.

Figure 4:
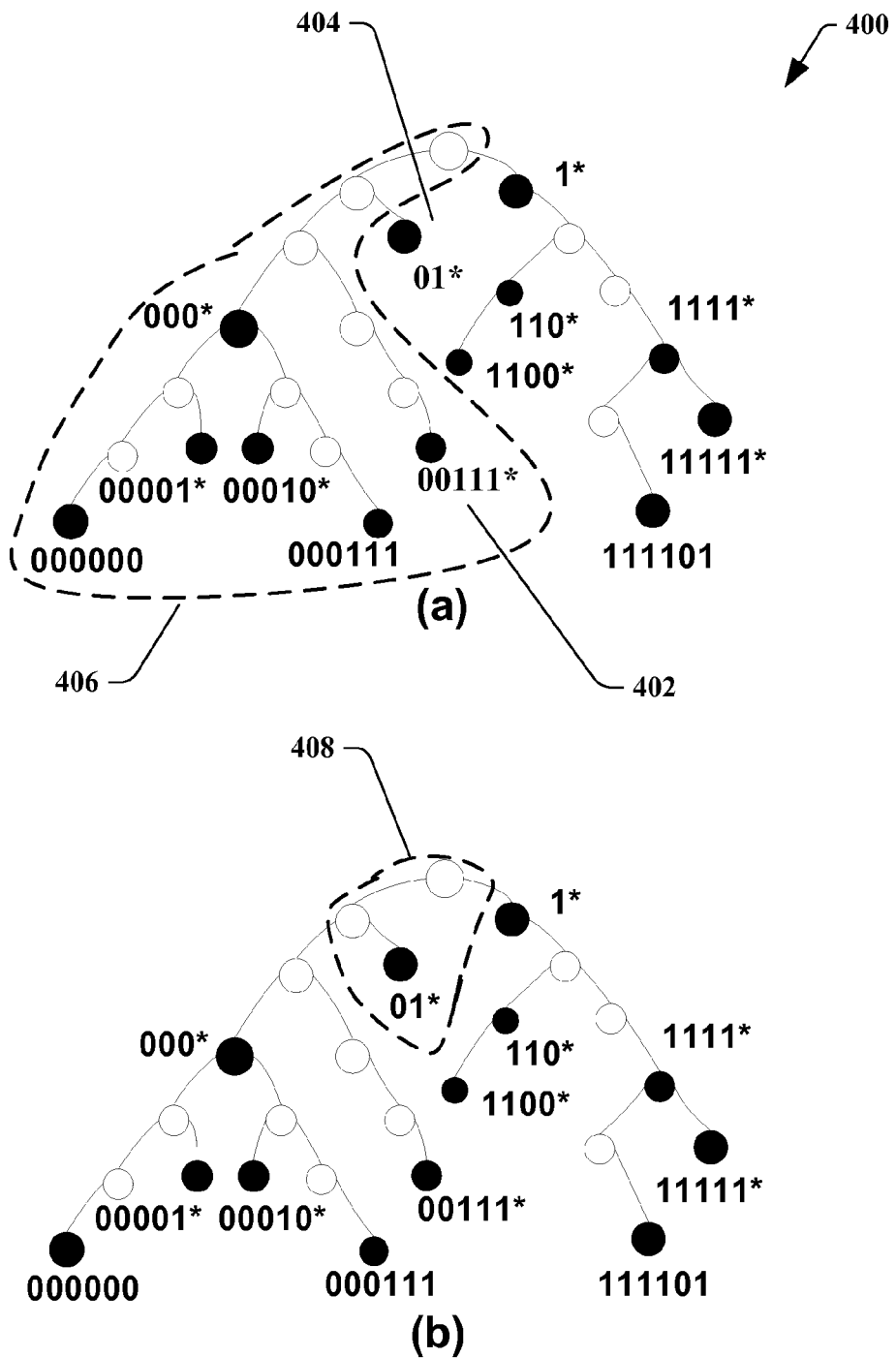
FIGS. 4-6 demonstrate an exemplary 1-bit trie, built from a route table, having black nodes denoting prefix nodes, and example output associated with an exemplary range-based partitioning algorithm as described herein.
Figure 5:
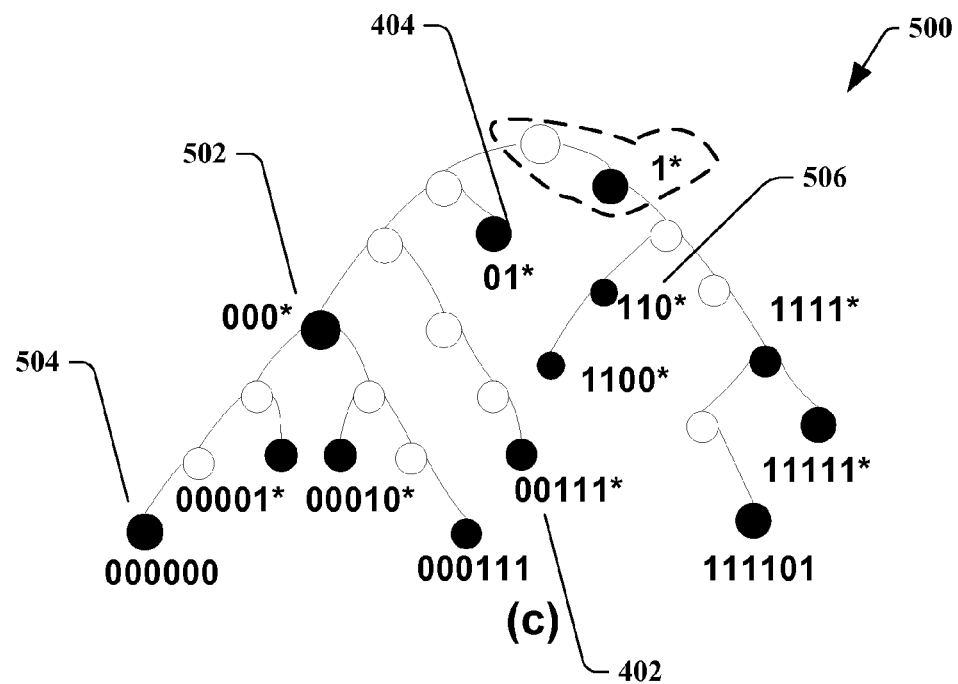
Figure 5:
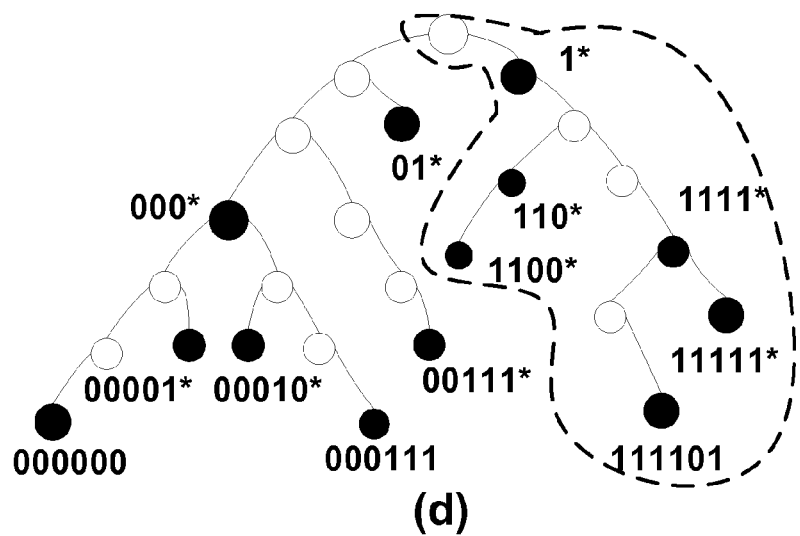
Figure 6:
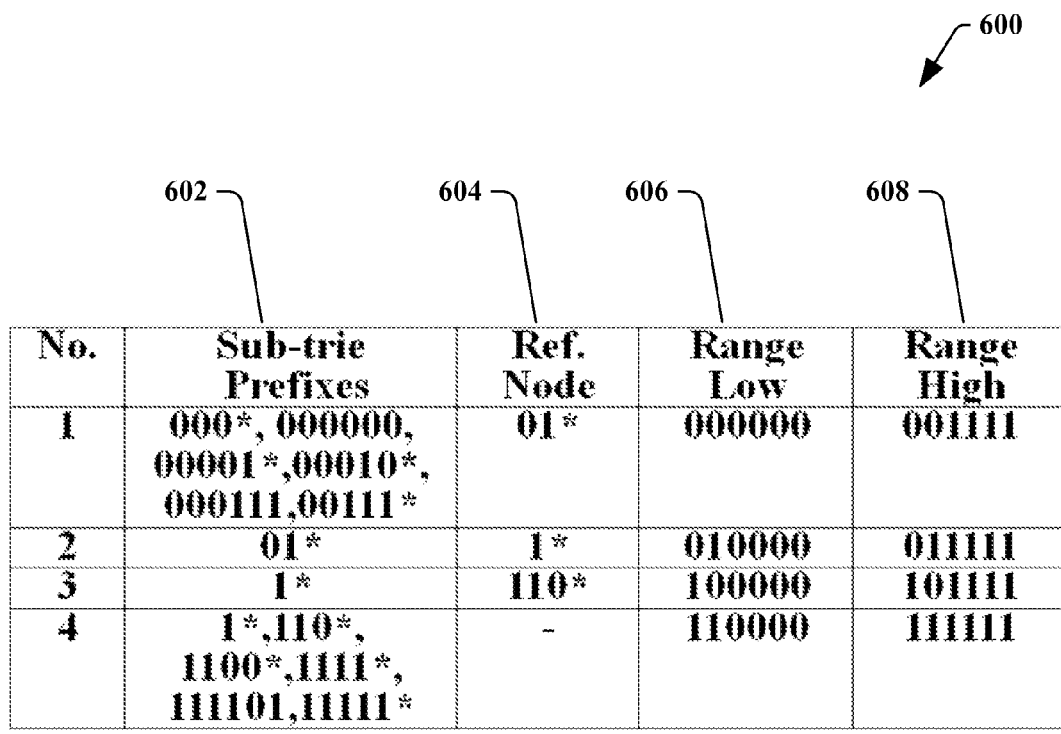

Thus, FIGS. 4-6 demonstrate an exemplary non-limiting illustration of a result of "Max-splitting(3)" according to various aspects of the disclosed subject matter. For instance, with its output, to lookup the route for an input address a, checking sub-trie [u] can be sufficient, where the value of a lies within the low and high range of sub-trie [u].

However, note that because the range of a sub-trie can be completely dependent on the reference node, the parameter r can facilitate obtaining a certain kind of boundary point. For example, when choosing the 00111* (node 402) as a break point (e.g., determining whether node 402 meets condition 1 and 2 above, etc.), its reference node is 01* (node 404), so the lower boundary for a remained trie (e.g., 408 of FIG. 4(*b*)) is 010000, while the upper boundary for a sub-trie (e.g., 406 of FIG. 4(*a*)) is 001111. As all the rightmost four bits are padding (e.g., zeros or ones), using two bits to indicate the boundaries can be considered sufficient, according to various aspects. Therefore, "01" can be designated as an exclusive upper boundary of trie A and an inclusive lower boundary of trie B. According to various non-limiting implementations, experiments demonstrate that this constraint can greatly reduce the length of boundary strings.

Further note that those prefix nodes (e.g., black nodes) with a reference node (e.g., defined as the next prefix node of current prefix node in the order of pre-order traversal) on its leftmost branch cannot be chosen as a break point. Taking 000* (node 502) as an example, its reference node is 000000 (node 504). By choosing 000* as a break point, this trie involves only one prefix (000*) of the prefixes and the upper boundary for this sub-trie is "−1" according to the relations described above, which is understandably wrong. Another example would be 110* (node 506). As can be seen in FIG. 5 that, by choosing (node 506) as a breakpoint, we get a sub-trie with an upper boundary "101111". Latter, we choose 110* as break point to split the remained sub-trie, the same error as with 000* (node 502) happens. For the trie shown in FIGS. 4-5, it can be understood that, under no circumstances, 000* and 110* are the candidates of being a break point.

FIG. 6 depicts non-limiting output 600 of the exemplary range-based portioning algorithm "Max-splitting." For instance, the output 600 index can comprise the sub-trie number, the amount and character of sub-trie prefixes 602 and corresponding reference nodes 604, and low 606 and high 608 ranges. As further described herein, the output is capable of being deployed in multi-stage indexes and/or into separated memories which can be pipelined as well, as further described below regarding FIG. 7, for example, and can be compressed, as further described herein regarding FIG. 12, for example.

In addition, note that redundant ancestor prefixes are duplicated to ensure LPM and sub-tries are completely independent. Hence, updating of "Max-splitting" can be expected to be much easier. For instance, FIG. 7 depicts a comparison 700 of conventional range-based algorithms 702 and index-based algorithms 704 with exemplary range-based partitioning algorithms 706 and 708 according to non-limiting aspects of the disclosed subject matter. Assuming for the purpose of illustration and not limitation, that there can be six prefixes that can overlap with each other as depicted in FIG. 7, the traditional range-based algorithm 702 can be expected to be the greediest one. For instance, traditional range-based algorithm 702 can facilitate detecting all (or substantially all) the possible boundaries and can facilitate calculating the matched prefix (with longest length) for each range. While, such a highly optimized structure can accelerate the searching, it can greatly increase the number of boundary points as well as the update cost for coverage updating.

In contrast, various embodiments of the disclosed subject matter can employ relatively more conservative algorithms. As a non-limiting example, various embodiments can be adapted to choose boundary points which can be expected to help pruning an integrated sub-trie, according to a non-limiting aspect. Because rough result(s) can be held for each range, according to a non-limiting aspect, the update for coverage issue can be advantageously carried out by duplicating the incoming prefix to the corresponding sub-tries without detecting the longest matched prefixes for each disjoint range. For the updating besides the coverage issue, according to a further non-limiting aspect, the insert of a new and short prefix can simply trigger a sub-trie splitting, which can be expected to be trivial. In addition, during a delete operation, it can be understood that there is no extra operation when the involved prefixes are not break points or reference nodes of break points. Otherwise, a simple merging of two sub-tries can be enough, according to yet other non-limiting aspects.

Comparing the index-based algorithms 704 with a constrained "Max-splitting(r)" where r equals a certain value (706, 708), the derived range boundary could be completely different as illustrated in FIG. 7. Furthermore, as can be understood, progress can be expected to be different as well. For instance, without time-consuming full expansion and mapping, all, or substantially all, boundary points can be directly calculated through the reference node. Thus, according to various embodiments of the disclosed subject matter, "Max-splitting" as described herein can be expected to be more efficient, especially when a route table comprises loose and disjoint prefixes.

Moreover, note that although "Max-splitting" is described as a range-based algorithm, multi-stage indexing can be easily implemented on it, according to further non-limiting implementations. For example, as with conventional multi-stage index structures, multi-stage indexes can be deployed into separated memories which have been pipelined, according to a further advantage of the disclosed subject matter. Accordingly, possible matches can be located quickly while better memory usage can be achieved.

FIG. 8 illustrates a functional block diagram of an exemplary system 800 that can facilitate efficient lookup associated with a memory component in accordance with an aspect of the subject matter as disclosed herein. In various aspects, system 800 can be described as a hardware and/or software architecture of a lookup engine or component adapted to employ algorithms and associated and/or ancillary operations as described herein for current route. For example, FIG. 8 illustrates an exemplary structure for a non-limiting lookup engine or component that can comprise an index 802 created by "Max-splitting" (or other suitable partitioning algorithm or algorithms), a TCAM-based lookup engine or component 804 (e.g., a traditional TCAM-based lookup engine or component, a suitable variant thereof, etc.), and a memory and logic function unit lookup engine or component 806 termed "Memory Filter" (e.g., "Memory Filter" component 204, etc.).

Given an incoming IP packet 808 to be searched, the IP address can be extracted and delivered to the index, according to a non-limiting aspect. In response, the index 802 can return a sub-trie number indicating possible matches. If this sub-tie contains more than n prefixes, such as indicated in the second column of FIG. 6 (e.g., the amount and character of sub-trie prefixes 602 for a given reference node 604), for example, store and lookup for this sub-trie can be directed to the TCAM 810 of TCAM-based lookup engine or component 804. Otherwise, the store and lookup for this sub-trie can be directed to the "Memory Filter." Because, in particular non-limiting implementations, the "Memory Filter" only conducts very simple comparison, such as XOR operations of IP and certain prefixed masks, (e.g., IP XOR Prefix=?=Mask, etc.) and priority decoding in small scale, it still matches the speed of TCAM when n is small. For IPv4, each prefix requires about 42 bits storage (e.g., storage for a 32-bit IP, a 5-bit Mask, and a 5-bit next-hop interface). By introducing a 128-bit double data rate-synchronous DRAM (DDRAM) module to work at the same frequency as TCAM, n can easily reach 6, and with an even faster double data rate type three synchronous DRAM (DDR3) memory, it expected that even higher n can be achieved.

Thus, in various non-limiting implementations of exemplary system 800, a TCAM-based lookup engine or component 804 (e.g., a traditional TCAM-based lookup engine or component, a suitable variant thereof, etc.) can further comprise a TCAM 810 and an SRAM 812, as depicted in FIG. 8. In addition, for other non-limiting implementations of exemplary system 800, a memory and logic function unit lookup engine or component 806 termed "Memory Filter" (e.g., "Memory Filter" component 204, etc.) can also comprise a memory 814 (e.g., such as a relatively higher bandwidth memory than TCAM, DDRAM, DDR3, and so on, etc.), and a logic unit 814 (e.g., such as a dedicated logic unit, logic function unit, CPU, and so on, etc.).

In yet further non-limiting implementations of the disclosed subject matter, the index created by "Max-splitting" (or other suitable partitioning algorithms) can be compressed. For example, as described above, an index created by "Max-splitting" and the implementation of "Memory Filter" can facilitate providing a more cost-effective lookup engine. In addition, due in part to characteristics of "Max-splitting," the update cost of index and the indexing address space (r) have been dramatically reduced. For instance, for IPv4, a one-stage index with $2^{24}$ entries can be sufficient. However, for IPv6, although there were less than 2,000 IPv6 prefixes in the exemplary BGP table by the end of 2008, the estimated indexing address space would expand to 64 bits in the near future, which in turn can necessitate multi-stage indexes. As described, various embodiments of the disclosed subject matter can employ multi-stage indexes, as described herein, using IPv4 as a non-limiting example to demonstrate relevant points.

For instance, it can be understood that the total storage for m-stage index ($Storage_m$) and the average memory access per lookup (assuming the incoming lookups were uniform distribution) can be formulated as follows, where $i_j$ ($\Sigma ij=r$) can denote the bit length of j-th stage index and Count(k) can denote the unique leftmost k-bit tags among all the boundary points created by the "Max-splitting." In addition, Z can denote the number of sub-tries outputted by "Max-splitting (r)," where r equals 24 and Z equals 257,851, in an exemplary non-limiting implementation as further described below, for example, regarding FIG. 14.

$$Storage_m = \lceil \log_2^z \rceil \{2^{i_1} + 2^{i_2}\text{Count}(i_1) + \qquad (1)$$
$$2^{i_3}\text{Count}(i_1 + i_2) + \ldots + 2^{i_m}\text{Count}(i_1 + i_2 + \ldots + i_{m-1})\}$$

$$Access_m = \qquad (2)$$
$$\left\{1 + \frac{\text{Count}(i_1)}{2^{i_1}} + \frac{\text{Count}(i_1 + i_2)}{2^{(i_1+i_2)}} + \ldots + \frac{\text{Count}(i_1 + i_2 + \ldots i_m)}{2^{(i_1+i_2+\ldots i_m)}}\right\}$$

Thus, for an exemplary 2-stage index according to this non-limiting implementation, the storage required can be formulated as follows:

$$Storage_2 = 18 \cdot [2^k + 2^{24-k} \cdot \text{Count}(k)] \qquad (3)$$

Thus, various non-limiting implementations of the disclosed subject matter can provide systems and devices that can facilitate address lookup. As a non-limiting example, exemplary system 800 can comprise an IP address lookup system that can comprise an index component 202 adapted to generate an index 802 based on a route table and to divide the route table based on the index into one or more sub-tries or sub-tables, according to various non-limiting aspects. In another non-limiting aspect, index component 202 can be further configured to divide the route table into the one or more sub-tries or sub-tables having disjoint range boundaries, as described above. Moreover, exemplary system 800 can be further configured to receive a packet 808 comprising a target IP address falling within one of the sets of associated high and low ranges and/or transmit a route associated with the target IP address based in part on the reference nodes, as described above. For instance, given an incoming IP packet 808 comprising an IP address to be searched, the IP address can be extracted and provided to the index component 202, which, by reference to the index, can return a sub-trie number indicating possible matches. If this sub-trie comprises more than n prefixes, store and lookup for this sub-trie can be directed to TCAM-based lookup component 206. Otherwise, store and lookup for this sub-trie can be directed to the Memory Filter component 204.

In still other non-limiting implementations, an IP address lookup system 800 can further comprise a Memory Filter component 204 (e.g., Memory Filter 806) that can be configured to store a first set of the one or more sub-tries or sub-tables in a memory 814 (e.g., a conventional memory, a Memory Filter component 204 subcomponent, and so on, etc.). In still other exemplary implementations, exemplary system 800 can comprise a TCAM-based lookup component 206 (e.g., TCAM-based lookup engine or component 804) that can be adapted to store a second set of the one or more sub-tries or sub-tables in a TCAM (e.g., in a TCAM 810, a combination of TCAM 810 and/or SRAM 812, and so on, etc.). According to further non-limiting embodiments, the Memory Filter component 204 (e.g., Memory Filter 806) and the TCAM-based lookup component 206 (e.g., TCAM-based lookup engine or component 804) can be further configured to store the first and second sets based on the number of prefixes in the sub-table being less than or greater than a predetermined number, respectively.

According to still further non-limiting embodiments, exemplary system 800 can further comprise a means for separating a route table, based in part on an index, into one or more sub-tables, such as by index component 202, as further described herein. In addition, exemplary system 800 can include a means for storing a first set of the one or more sub-tables in a memory as a function of a number of prefixes in a sub-table of the one or more sub-table meeting a predefined criterion, such as via index component 202, Memory Filter component 204, portions or subcomponents thereof, and/or combinations and so on, etc., as further described herein. In yet other non-limiting implementations exemplary system 800 can also comprise a means for storing a second set of the one or more sub-tables in a ternary content addressable memory based on the number of prefixes in the sub-table not meeting the predefined criterion such as via index component 202, the TCAM-based lookup component 206, portions or subcomponents thereof, and/or combinations and so on, etc., as further described herein.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

It can be understood that various techniques described herein may be implemented in connection with hardware or software or, where appropriate, with a combination of both. As used herein, the terms "device," "component," "system" and the like are likewise intended to refer to a computer-related entity, either hardware, a combination of hardware and software, software, or software in execution. For example, a "device," "engine," "component," "subcomponent," "system" portions thereof, and so on, may be, but is not limited to being, a process running on a processor, a processor, an object, an executable, a thread of execution, a program, and/or a computer. By way of illustration, both an application running on computer and the computer can be a component. One or more component(s) may reside within a process and/or thread of execution and a component may be localized on one computer and/or distributed between two or more computer(s).

Accordingly, further non-limiting implementations can comprise a processor as described below, for example, regarding FIGS. 13-14, and/or computer readable instructions stored on a non-transitory computer readable storage medium (e.g., a memory, a hard disk drive, and so on, etc.), the computer readable instructions, in response to execution (e.g., by a computing device, such as a processor, etc.), can cause the computing device perform operations, according to various aspects of the disclosed subject matter. For instance, as a non-limiting example, the computer readable instructions, in response to execution by a computing device, can cause the computing device to divide a route table, based on an index, into one or more sub-tries or sub-tables, store a first set of the one or more sub-tries or sub-tables in a memory (e.g., such as high bandwidth memory 816, etc.) based on a number of prefixes in a sub-trie or sub-table of the one or more sub-tries or sub-tables being less than a predetermined number (e.g., less than n, etc.), storing a second set of the one or more sub-tries or sub-tables in a TCAM (e.g., in a TCAM 810, a combination of TCAM 810 and/or SRAM 812, and so on, etc.) based on the number of prefixes in the sub-trie or sub-table being not less than greater than the predetermined number (e.g., greater than or equal to n, etc.), generate the index based on the route table with a range-based partitioning algorithm (e.g., Max-splitting, or other suitable algorithm or algorithms, etc.) (e.g., generate, for a reference node, respective sub-trie or sub-table prefixes for the one or more sub-tries or sub-tables and sets of associated high and low), compress the index, transmit a route associated with a target IP address based on the reference nodes and in response to receiving a packet (e.g., a packet comprising the target IP address that can fall within one of the sets of associated high and low ranges, etc.), and so on, etc., as described herein.

It can be further understood that while a brief overview of exemplary systems, methods, scenarios, and/or devices has been provided, the disclosed subject matter is not so limited. Thus, it can be further understood that various modifications, alterations, addition, and/or deletions can be made without departing from the scope of the embodiments as described herein. Accordingly, similar non-limiting implementations can be used or modifications and additions can be made to the described embodiments for performing the same or equivalent function of the corresponding embodiments without deviating therefrom.

Figure 9:
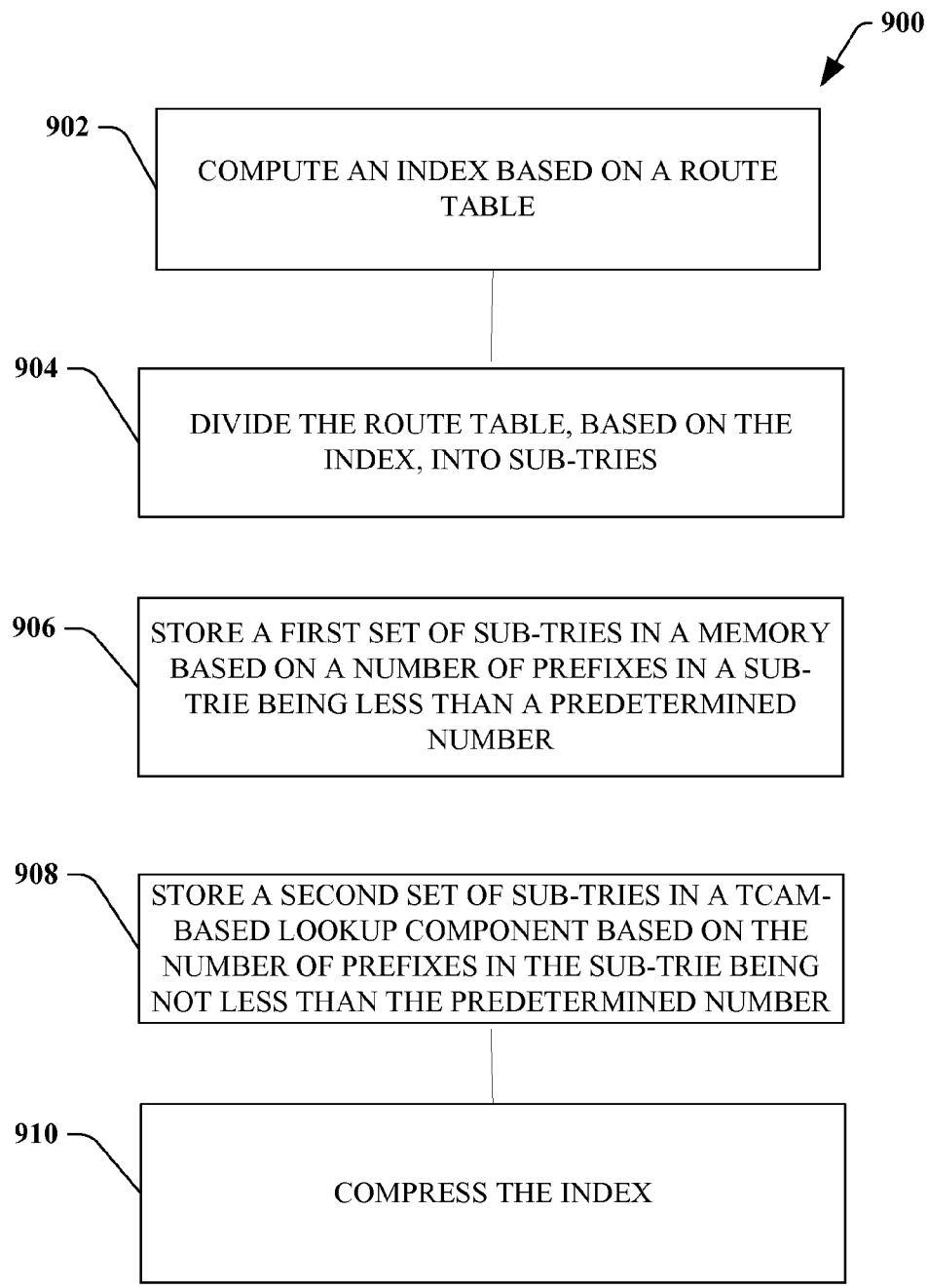
FIG. 9 depicts methods that can facilitate efficient lookup associated with a memory component in accordance with aspects of the subject matter as disclosed herein.

FIG. 9 illustrates methods and/or flow diagrams in accordance with the disclosed subject matter. For simplicity of explanation, the methods are depicted and described as a series of acts. It is to be understood and appreciated that the disclosed subject matter is not limited by the acts illustrated and/or by the order of acts. For example acts can occur in various orders and/or concurrently and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers or computer-related components for execution thereby. The term article of manufacture, as used herein, is intended to encompass a computer program accessible from any computer-readable device, media, and so on.

Exemplary Methods

FIG. 9 depicts methods 900 that can facilitate efficient lookup (e.g., IP address lookup, etc.) associated with a memory component in accordance with aspects of the subject matter as disclosed herein. For instance, methods 900 that facilitate IP address lookup can include computing an index based on a route table with range-based partitioning, at 902, as further described herein. For instance, computing the index can further comprise computing, for a reference node, one or more respective sub-trie prefixes for the one or more sub-tries and associated sets of high and low ranges of the disjoint ranges. In addition, methods 900 can further comprise, at 904 dividing the route table, based on the index, into one or more sub-tries having disjoint ranges.

In further non-limiting implementations, methods 900 can also comprise storing a first set of the one or more sub-tries in a memory, as described herein, based on a number of prefixes in a sub-trie of the one or more sub-tries being less than a predetermined number (e.g., less than n, etc.) at 906. For instance, storing the first set can include storing the first set of the one or more sub-tries in a memory filter component 202 comprising the memory (e.g., high bandwidth memory 814, etc.) and/or a logic function unit (e.g., dedicated logic unit 816, etc.). At 908, the methods 900 can include storing a second set of the one or more sub-tries in a TCAM-based lookup component, as described herein, based on the number of prefixes in the sub-tie being not less than the predetermined number (e.g., greater than or equal to n, etc.). Moreover, at 910 methods 900 can include compressing the index as further described herein.

In other exemplary embodiments, methods 900 can comprise updating the index, the first set, or the second set of the one or more sub-tries based on determining that a route table update is due as described above. In still other exemplary embodiments, methods 900 can further comprise receiving a packet (e.g., packet 102, packet 808, etc.) comprising a target IP address falling within one of the sets of associated high and low ranges, and can further include transmitting a route associated with the target IP address based on the reference nodes.

Exemplary Results

Figure 10:
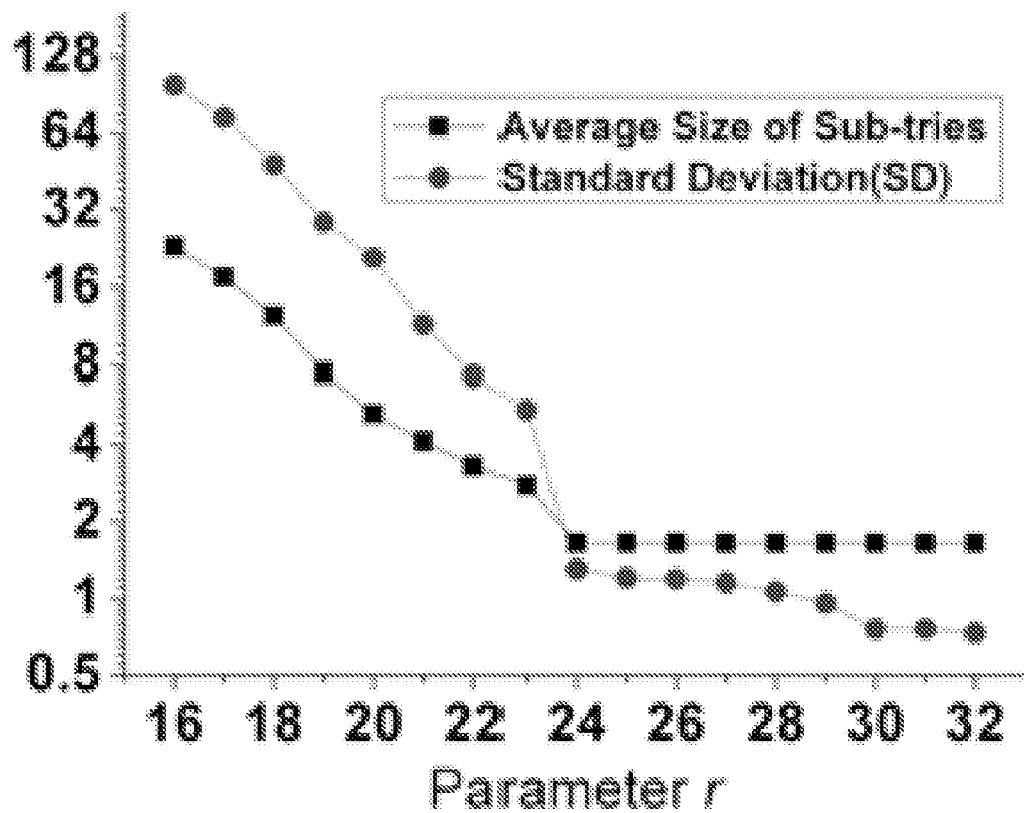
FIGS. 10-12 demonstrates exemplary performance characteristics, simulation results, and non-limiting storage requirements for exemplary non-limiting implementations of the disclosed subject matter.
Figure 11:
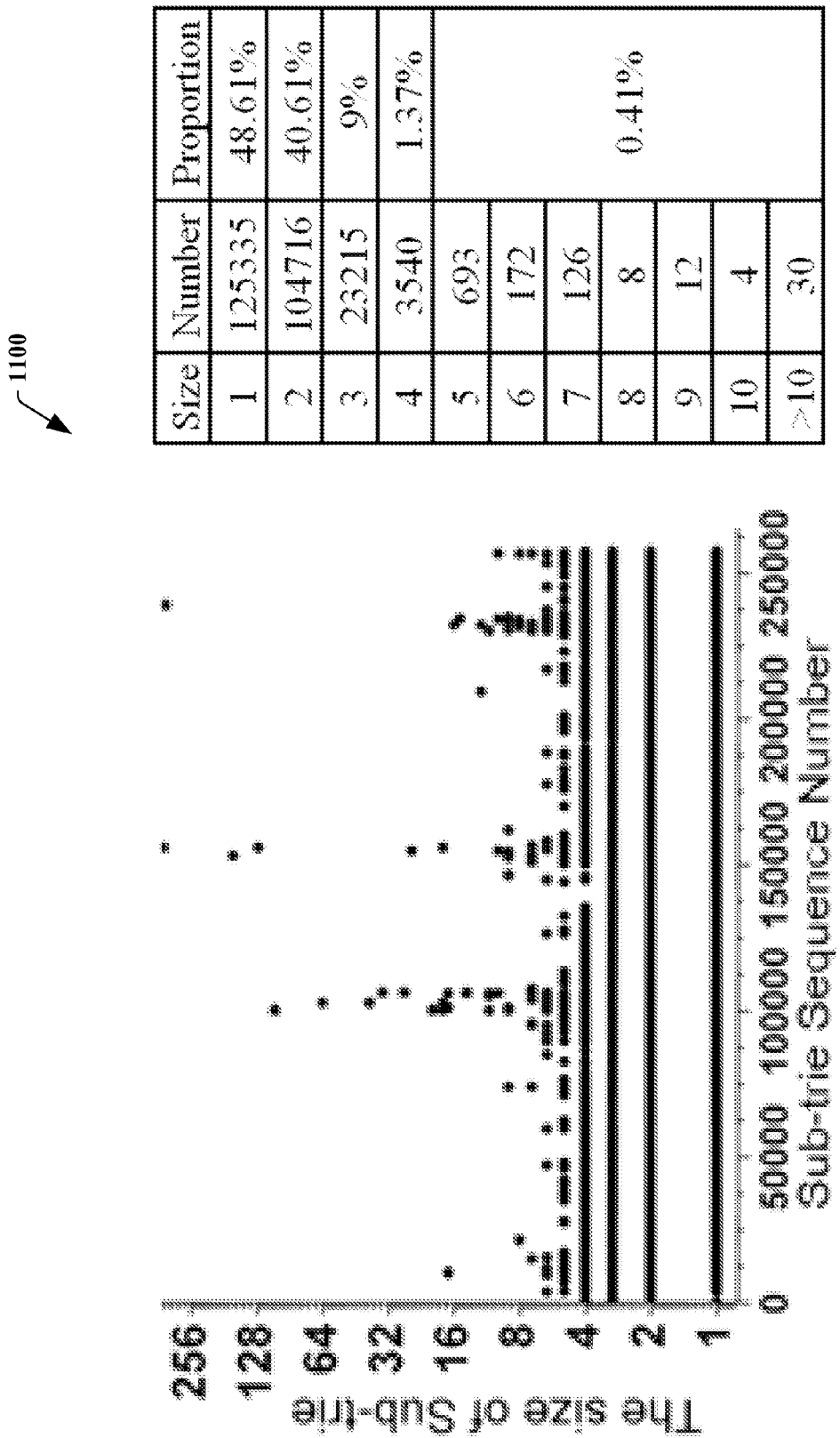
Figure 12:
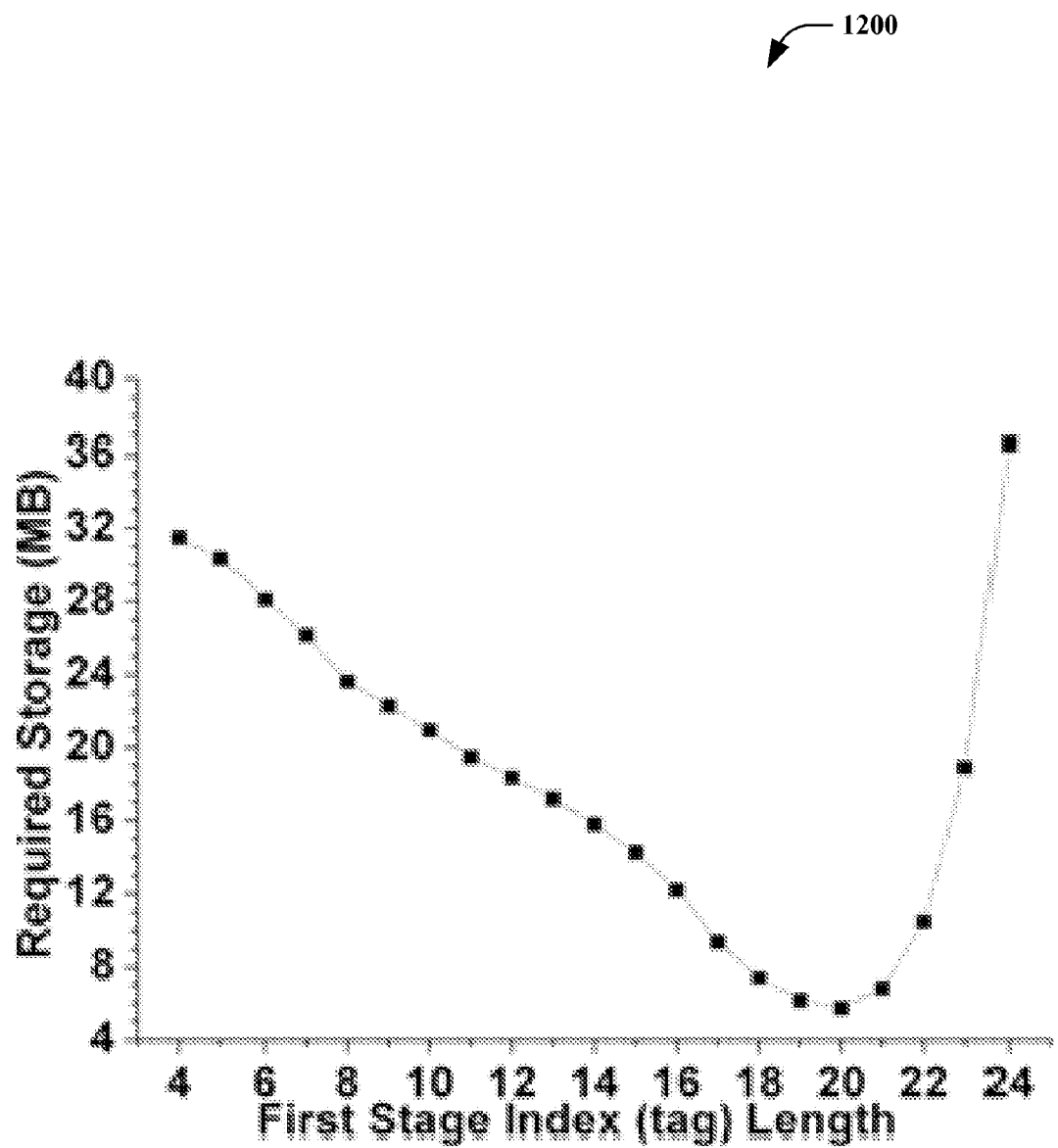

FIGS. 10-12 demonstrate simulated performance characteristics and storage requirements for exemplary non-limiting implementations of the disclosed subject matter. For example, to evaluate the performance characteristics of an exemplary non-limiting "Memory Filter", route tables provided by University of Oregon's Route-Views Project were determined to reveal similar results. Consequently, the simulated performance characteristics and storage requirements presented herein are experimental data based on the largest route table available (e.g., Equinix). Note that as the BGP route table contained less than 2,000 IPv6 prefixes by the end of 2008, only IPv4 prefixes are present herein, where the corresponding route details are of Equinix located in Ashburn, Va. on 2008 Dec. 1 00:26 (UTC) with a size of 277187; ISC located in Palo Alto Calif., USA on 2008 Dec. 1 01:30 (UTC) with a size of 276370; LINX located in London, GB on 2008 Dec. 1 01:13 (UTC) with a size of 270369; DIXIE located in Tokyo, Japan on 2008 Dec. 1 01:33 (UTC) with a size of 274646.

As indicated in FIG. 10, average size of sub-tries and corresponding standard deviation (SD) does not change a appreciably when r is larger than 24. Further investigation shows that there were only 3,111 prefixes longer than 24 bits, and bigger r (r>24) does not result in more slender splitting. Therefore, in accordance with a further non-limiting aspect, various embodiments can by choosing 24 as the default value of r is a perfect balance between the size of a sub-trie and the indexing address space. FIG. 11 is a detailed result with r=24, for a route table with 277,187 entries, according to a non-limiting aspect. The output of "Max-splitting" is 257,851 sub-tries with average size of 1.65109, where a total of 152, 203 ancestor prefixes have been introduced as redundancy, as described herein.

As illustrated in FIG. 11, most of the sub-tries comprise less than 8 prefixes while very few of them reach the peak of 344. It is further noted that there are only 0.41% sub-tries containing more than 4 prefixes in this exemplary implementation. Therefore, when n=4, at least 256,806 prefixes (e.g., the number is underestimated by assuming there is only one unduplicated prefix for each sub-trie) can be processed by the "Memory Filter" instead of TCAM, which equates to 92.65% (256806/277187) of the original size of route table, noting that the exemplary "Memory Filter" only holds 418,572 ($\Sigma$(size*number)) entries of prefixes. In other words, storage can be exchanged between conventional memory and TCAM with a ratio of less than 2, achieving much lower storage requirement and power consumption for TCAM, according to various non-limiting embodiments. In further non-limiting implementations, because TCAM is widely used in routers for the other tasks (e.g., flow-classification, etc.), the remained TCAM can be expected to be small, such that it can facilitate TCAM sharing with other modules inside a router according to various non-limiting aspects as described herein.

Alternatively, if the index can be expected to be fast enough, even more enhanced system performance can be achieved by executing the "Memory Filter" and TCAM in parallel.

FIG. 12 presents storage requirements for exemplary non-limiting implementations of the disclosed subject matter. Accordingly, it can be seen in FIG. 12 that the best configuration for compression of the exemplary index would be "20+4," which denotes a 20-bit tag and 4-bit offset. As Count (20) equals 101,313, when incoming lookups are uniformly distributed among a 32-bit IP address space, average access per lookup can be expected to be approximately only 1.097, while the index requires less than 6 Megabytes (MB) of extra storage.

Obviously, $\{Count(i)/2^i\}$ has to be monotonic decreasing function of i, unless the route table is full of $2^{24}$ 24-bit long prefixes. Thus, according to Equation (2), as the length of the first stage index increases, the average access for index mainly depends on the extra access which occurs at the first stage. Hence, in order to reduce average access time of index, aside from the index size, a larger first stage index can be implemented in further non-limiting aspects, especially for IPv6, where a multi-stage index can be considered essential.

Exemplary Networked and Distributed Environments

One of ordinary skill in the art can appreciate that the various embodiments of disclosed and related systems, devices, and/or methods described herein can be implemented in connection with any computer or other client or server device, which can be deployed as part of a computer network or in a distributed computing environment, and can be connected to any kind of data store. In this regard, the various embodiments described herein can be implemented in any computer system or environment having any number of memory or storage units, and any number of applications and processes occurring across any number of storage units. This includes, but is not limited to, an environment with server computers and client computers deployed in a network environment or a distributed computing environment, having remote or local storage.

Distributed computing provides sharing of computer resources and services by communicative exchange among computing devices and systems. These resources and services include the exchange of information, cache storage and disk storage for objects, such as files. These resources and services also include the sharing of processing power across multiple processing units for load balancing, expansion of resources, specialization of processing, and the like. Distributed computing takes advantage of network connectivity, allowing clients to leverage their collective power to benefit the entire enterprise. In this regard, a variety of devices may have applications, objects or resources that may utilize disclosed and related systems, devices, and/or methods as described for various embodiments of the subject disclosure.

Figure 13:
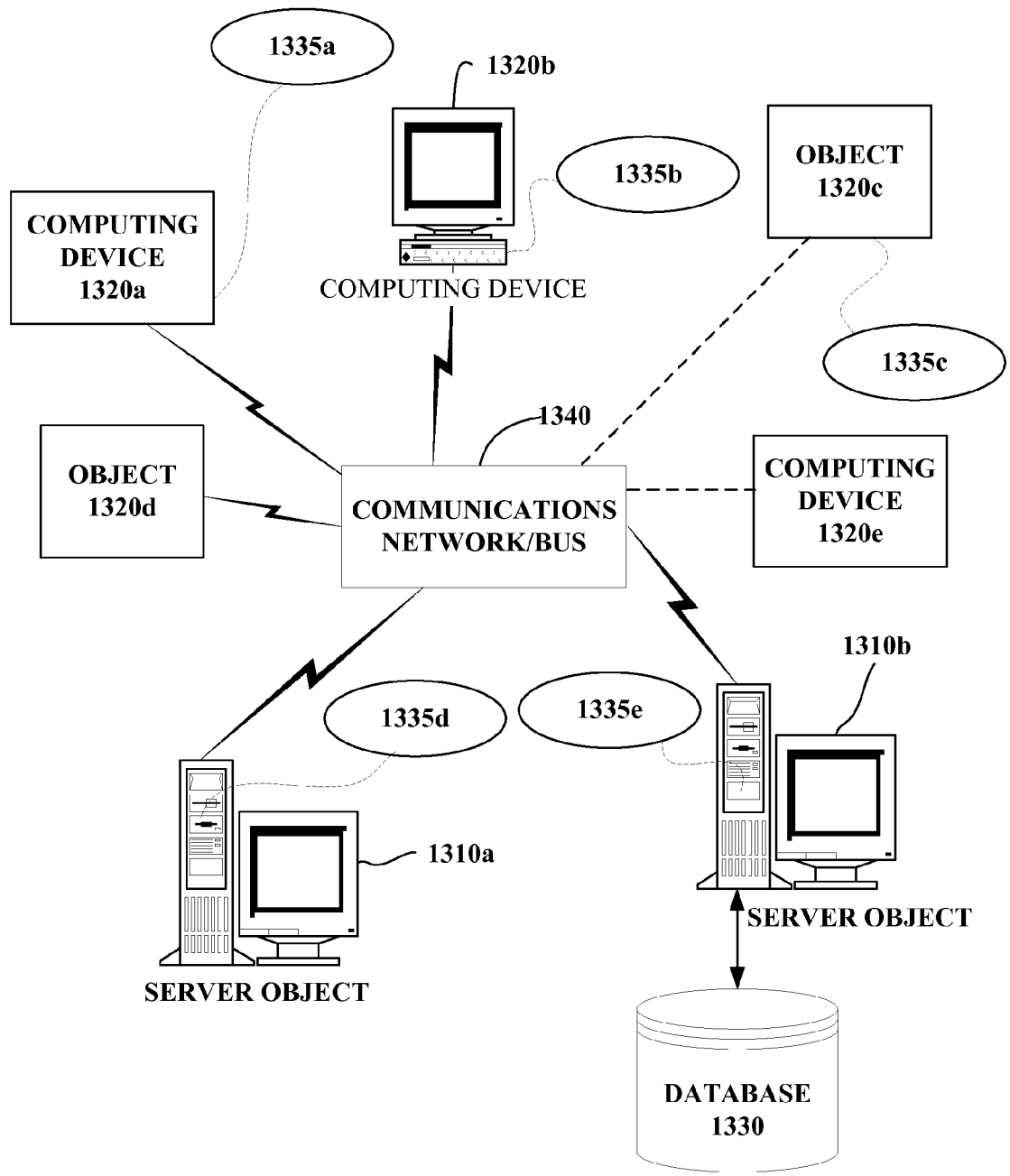
FIG. 13 is a block diagram representing an exemplary non-limiting networked environment in which the disclosed subject matter may be implemented.

FIG. 13 provides a schematic diagram of an exemplary networked or distributed computing environment. The distributed computing environment comprises computing objects 1310, 1312, etc. and computing objects or devices 1320, 1322, 1324, 1326, 1328, etc., which may include programs, methods, data stores, programmable logic, etc., as represented by applications 1330, 1332, 1334, 1336, 1338. It can be understood that objects 1310, 1312, etc. and computing objects or devices 1320, 1322, 1324, 1326, 1328, etc. may comprise different devices, such as PDAs, audio/video devices, mobile phones, MP3 players, personal computers, laptops, etc.

Each object 1310, 1312, etc. and computing objects or devices 1320, 1322, 1324, 1326, 1328, etc. can communicate with one or more other object(s) 1310, 1312, etc. and computing object(s) or device(s) 1320, 1322, 1324, 1326, 1328, etc. by way of the communications network 1340, either directly or indirectly. Even though illustrated as a single element in FIG. 13, network 1340 may comprise other computing objects and computing devices that provide services to the system of FIG. 13, and/or may represent multiple interconnected networks, which are not shown. Each object 1310, 1312, etc. or 1320, 1322, 1324, 1326, 1328, etc. can also contain an application, such as applications 1330, 1332, 1334, 1336, 1338, that might make use of an API, or other object, software, firmware and/or hardware, suitable for communication with or implementation of disclosed and related systems, devices, methods, and/or functionality provided in accordance with various embodiments of the subject disclosure.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to employing disclosed and related systems, devices, and/or methods as described in various embodiments.

Thus, a host of network topologies and network infrastructures, such as client/server, peer-to-peer, or hybrid architectures, can be utilized. The "client" is a member of a class or group that uses the services of another class or group to which it is not related. A client can be a process, e.g., roughly a set of instructions or tasks, that requests a service provided by another program or process. The client process utilizes the requested service without having to "know" any working details about the other program or the service itself.

In a client/server architecture, particularly a networked system, a client is usually a computer that accesses shared network resources provided by another computer, e.g., a server. In the illustration of FIG. 13, as a non-limiting example, computers 1320, 1322, 1324, 1326, 1328, etc. can be thought of as clients and computers 1310, 1312, etc. can be thought of as servers where servers 1310, 1312, etc. provide data services, such as receiving data from client computers 1320, 1322, 1324, 1326, 1328, etc., storing of data, processing of data, transmitting data to client computers 1320, 1322, 1324, 1326, 1328, etc., although any computer can be considered a client, a server, or both, depending on the circumstances. Any of these computing devices may be processing data, forming metadata, synchronizing data or requesting services or tasks that may implicate disclosed and related systems, devices, and/or methods as described herein for one or more embodiment(s).

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to disclosed and related systems, devices, and/or methods can be provided standalone, or distributed across multiple computing devices or objects.

In a network environment in which the communications network/bus 1340 is the Internet, for example, the servers 1310, 1312, etc. can be Web servers with which the clients

1320, 1322, 1324, 1326, 1328, etc. communicate via any of a number of known protocols, such as the hypertext transfer protocol (HTTP). Servers 1310, 1312, etc. may also serve as clients 1320, 1322, 1324, 1326, 1328, etc., as may be characteristic of a distributed computing environment.

Exemplary Computing Device

As mentioned, advantageously, the techniques described herein can be applied to devices or systems where it is desirable to employ disclosed and related systems, devices, and/or methods. It should be understood, therefore, that handheld, portable and other computing devices and computing objects of all kinds are contemplated for use in connection with the various embodiments, e.g., anywhere that a device can provide a placement opportunity for an application, such as a software application from an ISV, or a service, such as an online service, (or links, or references thereto, etc.). Accordingly, the below general purpose remote computer described below in FIG. 14 is but one example of a computing device. Additionally, disclosed and related systems, devices, and/or methods can include one or more aspect(s) of the below general purpose computer, such as display, storage, analysis, control, etc.

Although not required, embodiments can partly be implemented via an operating system, for use by a developer of services for a device or object, and/or included within application software that operates to perform one or more functional aspect(s) of the various embodiments described herein. Software may be described in the general context of computer executable instructions, such as program modules, being executed by one or more computer(s), such as client workstation(s), server(s) or other device(s). Those skilled in the art will appreciate that computer systems have a variety of configurations and protocols that can be used to communicate data, and thus, no particular configuration or protocol should be considered limiting.

Figure 14:
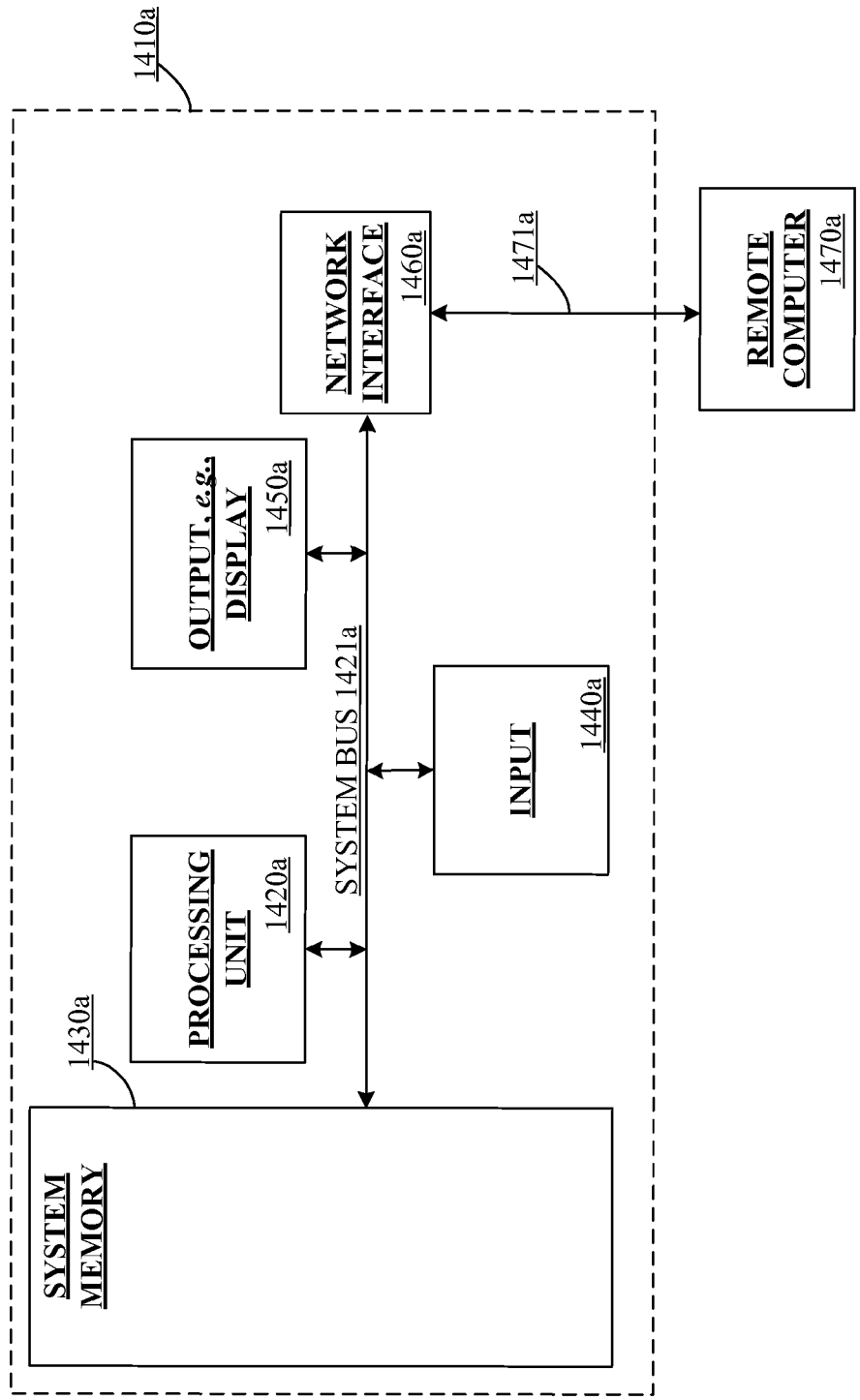
FIG. 14 is a block diagram representing an exemplary non-limiting computing system or operating environment in which the disclosed subject matter may be implemented.

FIG. 14 thus illustrates an example of a suitable computing system environment 1400 in which one or aspects of the embodiments described herein can be implemented, although as made clear above, the computing system environment 1400 is only one example of a suitable computing environment and is not intended to suggest any limitation as to scope of use or functionality. Neither should the computing environment 1400 be interpreted as having any dependency or requirement relating to any one or combination of components illustrated in the exemplary operating environment 1400.

With reference to FIG. 14, an exemplary remote device for implementing one or more embodiment(s) includes a general purpose computing device in the form of a computer 1410. Components of computer 1410 may include, but are not limited to, a processing unit 1420, a system memory 1430, and a system bus 1422 that couples various system components including the system memory to the processing unit 1420.

Computer 1410 typically includes a variety of computer readable media and can be any available media that can be accessed by computer 1410. The system memory 1430 may include computer storage media in the form of volatile and/or nonvolatile memory such as read only memory (ROM) and/or random access memory (RAM). By way of example, and not limitation, memory 1430 may also include an operating system, application programs, other program modules, and program data.

A user can enter commands and information into the computer 1410 through input devices 1440. A monitor or other type of display device is also connected to the system bus 1422 via an interface, such as output interface 1450. In addition to a monitor, computers can also include other peripheral output devices such as speakers and a printer, which may be connected through output interface 1450.

The computer 1410 may operate in a networked or distributed environment using logical connections to one or more other remote computer(s), such as remote computer 1470. The remote computer 1470 may be a personal computer, a server, a router, a network PC, a peer device or other common network node, or any other remote media consumption or transmission device, and may include any or all of the elements described above relative to the computer 1410. The logical connections depicted in FIG. 14 include a network 1472, such local area network (LAN) or a wide area network (WAN), but may also include other networks/buses. Such networking environments are commonplace in homes, offices, enterprise-wide computer networks, intranets and the Internet.

As mentioned above, while exemplary embodiments have been described in connection with various computing devices and network architectures, the underlying concepts may be applied to any network system and any computing device or system in which it is desirable to employ disclosed and related systems, devices, and/or methods.

Also, there are multiple ways to implement the same or similar functionality, e.g., an appropriate API, tool kit, driver code, operating system, control, standalone or downloadable software object, etc. which enables applications and services to use disclosed and related systems, devices, methods, and/or functionality. Thus, embodiments herein are contemplated from the standpoint of an API (or other software object), as well as from a software or hardware object that implements one or more aspect(s) of disclosed and related systems, devices, and/or methods as described herein. Thus, various embodiments described herein can have aspects that are wholly in hardware, partly in hardware and partly in software, as well as in software.

In addition, the words "exemplary" and "non-limiting" are used herein to mean serving as an example, instance, or illustration. For the avoidance of doubt, the subject matter disclosed herein is not limited by such examples. Moreover, any aspect or design described herein as "exemplary" and/or "non-limiting" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

As mentioned, the various techniques described herein may be implemented in connection with hardware or software or, where appropriate, with a combination of both. As used herein, the terms "component," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. In addition, one or more component(s) may reside within a process and/or thread of execution and a component may be localized on one computer and/or distributed between two or more computer(s).

Systems described herein can be described with respect to interaction between several components. It can be understood that such systems and components can include those components or specified sub-components, some of the specified components or sub-components, and/or additional components, and various permutations and combinations of the foregoing. Sub-components can also be implemented as components communicatively coupled to other components rather than included within parent components (hierarchical). Additionally, it should be noted that one or more component(s) may be combined into a single component providing aggregate functionality or divided into several separate sub-components, and that any one or more middle component layer(s), such as a management layer, can be provided to communicatively couple to such sub-components in order to provide integrated functionality. Any components described herein may also interact with one or more other component(s) not specifically described herein but generally known by those of skill in the art.

In view of the exemplary systems described herein, methods that can be implemented in accordance with the described subject matter can be better appreciated with reference to the flowcharts of the various figures and vice versa. While for purposes of simplicity of explanation, the methods may be shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be understood that various other branches, flow paths, and orders of the blocks, may be implemented which achieve the same or a similar result. Moreover, not all illustrated blocks may be required to implement the methods described hereinafter.

In addition to the various embodiments described herein, it is to be understood that other similar embodiments can be used or modifications and additions can be made to the described embodiment(s) for performing the same or equivalent function of the corresponding embodiment(s) without deviating therefrom. Still further, multiple processing chips or multiple devices can share the performance of one or more function(s) described herein, and similarly, storage can be effected across a plurality of devices. Accordingly, the invention should not be limited to any single embodiment, but rather should be construed in breadth, spirit and scope in accordance with the appended claims.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

As utilized herein, terms "component," "system," "interface," and the like, are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methods for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A method, comprising:
computing, by a system comprising a processor, an index based on a route table with range-based partitioning;
dividing, by the system, the route table, based in part on the index, into a plurality of sub-tries having disjoint ranges;
storing, by the system, a first set of the plurality of sub-tries in a memory based on a first number of prefixes in each of the first set of the plurality of sub-tries being determined to be less than a predetermined number; and
storing, by the system, a second set of the plurality of sub-tries in a ternary content addressable memory based lookup component based on a second number of prefixes in each of the second set of the plurality of sub-tries being determined not to be less than the predetermined number, wherein the predetermined number is a numerical value corresponding to an amount associated with the first number or second number.

2. The method of claim 1, further comprising compressing, by the system, the index.

3. The method of claim 1, further comprising updating, by the system, at least one of the index, the first set, or the second set of the plurality of sub-tries based on determining that a route table update is due.

4. The method of claim 1, wherein the storing the first set includes storing the first set of the plurality of sub-tries in a memory filter component comprising the memory and a logic function unit.

5. The method of claim 1, wherein the computing the index includes computing, for a reference node, at least one respective sub-trie prefix for the plurality of sub-tries and associated sets of high and low ranges of the disjoint ranges.

6. The method of claim 5, further comprising receiving, by the system, a packet comprising a target internet protocol (IP) address being a member of at least one of the sets of associated high and low ranges.

7. The method of claim 6, further comprising transmitting, by the system, a route associated with the target IP address based in part on the reference nodes.

8. A system comprising:
a memory to store computer-executable components; and
a processor communicatively coupled to the memory that executes or facilitates execution of the computer-executable components, the computer-executable components, comprising:
an index component adapted to generate an index based on a route table and to divide the route table, based in part on the index, into a plurality of sub-tries;
a memory filter component adapted to store a first set of the plurality of sub-tries in a memory; and
a ternary content addressable memory (TCAM)-based lookup component adapted to store a second set of the plurality of sub-tries in a TCAM, wherein the memory filter component and the TCAM-based lookup component are configured to store the first set and second set based on a count of prefixes in the first set or the second set being less than or greater than a predetermined number, respectively, and wherein the predetermined number is a numerical value corresponding to the count of prefixes.

9. The system of claim 8, wherein the index component is further configured to generate the index with a range-based partitioning algorithm.

10. The system of claim 8, further configured to compress the index.

11. The system of claim 8, wherein the index component is further configured to divide the route table into the plurality of sub-tries having disjoint range boundaries.

12. The system of claim 8, wherein the index component is further configured to generate, for a reference node, at least one respective sub-trie prefix for the plurality of sub-tries and associated sets of high and low ranges.

13. The system of claim 12, further configured to receive a packet comprising a target internet protocol (IP) address falling within one of the sets of associated high and low ranges.

14. The system of claim 13, further configured to transmit a route associated with the target IP address based in part on the reference node.

15. A non-transitory computer readable storage medium comprising computer-executable instructions that, in response to execution, cause a computing device comprising a processor to perform operations, comprising:
dividing a route table, based in part on an index, into a plurality of sub-tables;
storing a first set of the plurality of sub-tables in a memory based on a first number of prefixes in the first set of the plurality of sub-tables being less than a predetermined number; and
storing a second set of the plurality of sub-tables in a ternary content addressable memory based on a second number of prefixes in the second set of the plurality of sub-tables being not less than the predetermined number, wherein the predetermined number is a value associated with the first number or second number.

16. The non-transitory computer readable storage medium of claim 15, the operations further comprising:
generating the index based on the route table with a range-based partitioning algorithm.

17. The non-transitory computer readable storage medium of claim 15, the operations further comprising compressing the index.

18. The non-transitory computer readable storage medium of claim 17, wherein the generating the index includes generating, for a reference node, respective sub-table prefixes for the plurality of sub-tables and sets of associated high and low ranges.

19. The non-transitory computer readable storage medium of claim 18, the operations further comprising transmitting a route associated with a target internet protocol (IP) address based in part on the reference nodes and in response to receiving a packet comprising the target IP address falling within one of the sets of associated high and low ranges.

20. A system, comprising:
means for separating a route table, based in part on an index, into a plurality of sub-tables;
means for storing a first set of the plurality of sub-tables in a memory as a function of a first number of prefixes in the first set of the plurality of sub-tables meeting a predefined criterion; and
means for storing a second set of the plurality of sub-tables in a ternary content addressable memory based on a second number of prefixes in the second set of the plurality of sub-tables not meeting the predefined criterion, wherein the predefined criterion is whether the first number or the second number is less than a fixed count of prefixes.

* * * * *